US006847255B2

(12) United States Patent
Petrovic et al.

(10) Patent No.: US 6,847,255 B2
(45) Date of Patent: Jan. 25, 2005

(54) ZERO IF COMPLEX QUADRATURE FREQUENCY DISCRIMINATOR AND FM DEMODULATOR

(75) Inventors: Branislav A. Petrovic, La Jolla, CA (US); Maxim Ashkenasi, La Jolla, CA (US)

(73) Assignee: Broadband Innovations, Inc., San Diego, CA (US)

(*) Notice: Subject to any disclaimer, the term of this patent is extended or adjusted under 35 U.S.C. 154(b) by 352 days.

(21) Appl. No.: 09/872,143

(22) Filed: Jun. 1, 2001

(65) Prior Publication Data

US 2004/0207464 A1 Oct. 21, 2004

(51) Int. Cl.[7] .................. H03D 3/00; H03D 13/00; H03L 7/087

(52) U.S. Cl. .................. 329/323; 329/302; 327/3; 327/12; 327/40; 327/43; 331/25

(58) Field of Search .................. 329/300–303, 329/315, 323, 325, 326, 327, 357; 327/3, 12, 40, 43; 331/1 A, 25, DIG. 2

(56) References Cited

U.S. PATENT DOCUMENTS 5,412,351 A * 5/1995 Nystrom et al. ............ 332/103

* cited by examiner

*Primary Examiner*—David Mis
(74) *Attorney, Agent, or Firm*—Nath & Associates PLLC; Gary M. Nath; Gregory B. Kang

(57) ABSTRACT

A frequency discriminators (FD) and frequency modulation (FM) demodulators, utilizing single sideband (SSB) complex conversion directly to zero IF, suitable for direct demodulation at high frequencies of analog FM or digital FSK modulated signals, as well as for high speed frequency discrimination (or frequency comparison) in applications such as frequency acquisition in frequency synthesizers. The complex SSB down-converter consists of a quad of mixers and quadrature splitters in both the signal path and local oscillator (LO) path. Each mixer receives both the signal and the LO, each either in-phase or quadrature. The outputs of mixers are combined in pairs, to produce the SSB in-phase (I) baseband signal and the SSB quadrature (Q) baseband signal. Both I and Q signals are then delayed, each multiplied by un-delayed version of the other one. The multiplication products are summed together, to produce an FD error signal, or an FM demodulated signal at the output. The delay time can be dynamically controlled, in order to set the FD frequency range or to adjust the gain of the FM demodulator.

10 Claims, 14 Drawing Sheets

ZERO IF COMPLEX QUADRATURE FREQUENCY DISCRIMINATOR AND FM DEMODULATOR

BACKGROUND OF THE INVENTION

1. Field of the Invention

This invention relates to frequency discriminators (FD) and frequency modulation (FM) demodulators, utilizing single sideband (SSB) complex conversion directly to zero intermediate frequency (IF), suitable for direct demodulation at high frequencies of analog FM or digital frequency shift keying (FSK) modulated signals, as well as for high speed frequency discrimination (or frequency comparison) in applications such as frequency acquisition in frequency synthesizers, operating at very high frequencies (in the order of 200 MHz, but not limited to), and especially to their use for frequency acquisition in low phase noise Rational Frequency Synthesizers (disclosed in related and commonly assigned U.S. patent application Ser. No. 09/580,513) thus offering significant performance improvements for advantageous applications such as cable television (CATV), high speed digital communications (digital TV and high speed cable data modems for internet applications), wireless communications and other consumer and commercial electronics devices in high frequency (HF), very high frequency (HF) and ultra high frequency (UHF) bands and beyond.

2. Background of the Related Art

Communication and other electronics systems use internally generated signals for various functions. Such signals are often generated by local oscillator sources for purposes of signal frequency up or down conversion, modulation/demodulation, as well as for various clock signals used by processors and controllers. It is often required that these signals have high spectral purity and low phase noise. Low phase noise is particularly important in communication systems using phase or frequency modulation schemes such as quadrature amplitude modulation (QAM) (which is used in digital cable TV and high speed data modems), quadrature phase modulation (QPSK) (which is used in digital cellular telephony), FM modulation (which is used in analog cellular telephony), and other similar modulation formats employed in other communication systems.

It is well known in the art that frequency synthesizers play a key role in generation of such high quality signals. It is also well known that a frequency discriminator (or frequency comparator) is an integral part of frequency synthesizers. A general discussion of phase lock loop (PLL) based frequency synthesizers is found in aforementioned commonly assigned U.S. patent application Ser. No. 09/580,513 entitled "Rational Frequency Synthesizers" which is incorporated herein in its entirety by this reference. As discussed therein, to achieve low phase noise, it is important to operate the synthesizer at high comparison frequencies. The comparison frequency in PLLs is the frequency at which the comparison (or detection) of the phase and frequency of the scaled versions of both the oscillator and reference signals actually occurs. The undesired noise originating in dividers and phase detector will be multiplied by the loop by a factor equal to the total division ratio in the loop. The multiplied noise will then phase modulate the voltage controlled oscillator (VCO) and will significantly degrade and limit its phase noise performance. This noise multiplication is often the key factor causing degradation of phase noise performance in synthesizers. Thus, to achieve low phase noise performance, it is important to keep the multiplication factor low, i.e. the comparison frequency high.

In a PLL frequency synthesizer, a frequency lock must occur before a phase lock can occur. During acquisition of the phase lock, the phase detector (PD) alone may not be able to provide an adequate steering signal necessary for locking, and additional means for assisting the frequency acquisition is often necessary. For the purpose of assisting, or enabling acquisition, various means are utilized, such as a frequency discriminator (FD) also called frequency detector, or other means such as frequency pre-tuning or frequency sweeping. In the acquisition process, the FD (or one of the aforementioned other means) provides a DC steering signal of the right polarity, consistent with the sense of the frequency difference which guides the oscillator in the right direction towards a frequency lock, or at least until the frequency falls inside the capture range of the PD. Thereafter, the PD is once again relied upon to keep the PLL phase-locked. As part of a negative feedback loop, the FD must provide a high (e.g. positive) voltage when the frequency at one input is higher than the other and a low (e.g. zero) voltage when the frequency at that input is lower than the other.

Among all methods used to perform this function the FD is by far the most commonly used means for frequency acquisition in PLL frequency synthesizers. The frequency discriminators of the prior art used in frequency synthesizers are inherently limited in speed. They utilize flip-flops with their reset line being fed back from the output, as illustrated in FIGS. 6A and 6B. The relatively long propagation delays and settling times of the flip-flops limit the maximum speed (or frequency) of the FD operation, and thus indirectly limits the maximum comparison frequency in a PLL employing such an FD.

FIGS. 6A and 6B show typical circuits used in the industry, which accomplish a combined PD and FD function, being the phase-frequency detection (PFD). They are the Dual-D and the Quad-D Flip-Flop PFDs respectively. These circuits are implemented with conventional logic, and often found in digital bi-polar or CMOS integrated circuits. The outputs of these PFDs need to drive a charge pump operating in conjunction with an external LPF or integrator. The charge pump (not shown in the figures) typically consists of a voltage-controlled current source that outputs either a positive or a negative current depending on the value of the control voltages (UP and DN lines). When UP and DN are equal the output current should be zero. When the frequency of one input is different from the other, the UP or the DN lines engage to pull the VCO frequency in the desired direction.

The limitations of these flip-flop based circuits are mainly related to speed (i.e. to the maximum operating frequency). Their physical limitations are the set-up and hold times of the flip flops, the propagation delays from their Clock, Reset and D inputs to the outputs, as well as the usual propagation delays of the combinatorial logic and their interconnections. Those limitations produce two types of artifacts associated particularly with the phase-detection, namely the "dead-zone" and the "blind-spot". The "dead zone" is the region where the phases of the two input signals ($F_{ref}$ and $F_{in}$) produce a close to zero error that goes undetected. The phase range of the dead zone is in the order of the phase delay caused by one or two units of propagation delays of the gates. To minimize this effect it would be necessary to reduce the compared frequencies until the phase error associated with this zone becomes insignificant. The "blind-spot" is the region where the phase difference approaches plus or minus 360°, in which the edges of every next cycle occurs during the resetting pulse to the PD flip-flops. This imposes the same type of speed limitations as the "dead zone". In a typical CMOS integrated circuit having typical gate and flip-flop delays of few nano-seconds and gate delays of few hundred pico-seconds, the maximum workable frequency might be well below 30 MHz for the phase-detection and not more than 60 MHz for the frequency discriminator.

Another disadvantage of performing phase detection using one of those PFDs is that they are quite noisy, and require a charge pump with a relatively narrow low-pass filter (or integrator) because the phase correction pulses to the charge pump may occur at very low frequencies. The frequency detection, although somewhat better in the Quad-D topology of FIG. 6B than that of the Dual-D of FIG. 6A, suffers from the same speed limitations as the phase detection. Scaling the input frequencies prior to the PFD would lessen the speed constraints. For example using a divider by N prior to both the $F_{ref}$ and $F_{in}$ inputs would make the PFD operate at 1/N times the frequency. While the FD function of the PFD would not suffer significantly by this scaling, the PD function would: operation at one Nth of the ED frequency would increase the PLL phase noise power contribution significantly as discussed earlier by increasing the total division ratio in the loop (usually between a factor of N and $N^2$). If the PLL phase noise is of the essence for a given design, then the PD needs to be capable of operating at higher comparison frequencies, so that N would be minimal. One such circuit would be a simple logic exclusive-OR gate, also known as XOR. Since this type of phase detector cannot perform the FD function, this function would need to be implemented separately.

Another disadvantage of the prior art FDs is that their gain (expressed in Volts/Hz) is low, and cannot be controlled. It can be seen from the transfer function outlined in FIG. 6C that when $F_{ref}$ and $F_{in}$ are within an octave of each other the gain is at its highest but it is still limited to $Vcc/F_{ref}$. The consequence is that when $F_{ref}$ and $F_{in}$, are very close to each other (i.e. close to lock condition) the steering voltage output (around ½ Vcc) would be extremely small, potentially slowing down the acquisition speed.

It should be noted that frequency discrimination is very similar to frequency demodulation. The frequency discriminator in synthesizer applications compares a frequency of interest to a reference frequency and produces a difference, or error signal. This signal must have the right polarity (sign), but does not need to be linearly proportional to the frequency difference of the two frequencies. For example, the error signal can be a bi-level signal, where one level corresponds to negative difference and the other to positive difference of the two frequencies, effectively providing a frequency comparator function. An FM demodulator, on the other hand, also needs to produce the difference (error) signal, but this time the error signal must be linearly proportional to the frequency difference. Increasing the demodulator gain to an extreme, the proportional signal can approach the bi-level signal. Further, a discriminator must operate down to DC frequency (DC coupled), while a demodulator may not have to operate down to DC, but often only down to some low frequency (AC coupled demodulator). In summary, a frequency discriminator can be viewed as a special case of a demodulator, i.e. as a high gain, DC coupled FM demodulator.

To provide better insight into the operation of frequency demodulators and discriminators of the present art, the analytical background of FM modulation and demodulation is reviewed below.

A Frequency Modulated (FM) waveform can be expressed as:

$$FM(t)=\cos[\omega_c t+\phi(t)] \quad (1)$$

where: $\omega_c$—FM carrier frequency $\phi(t)=k_v\int m(t)dt$—instantaneous phase (or angle, argument) of the waveform $\phi'(t)=k_v m(t)=\delta\omega(t)$—instantaneous frequency deviation m(t)—modulation signal, i.e. base band (BB) information $k_v$—constant of proportionality in the FM modulator i.e. in FM modulation, instantaneous frequency deviation $\delta\omega(t)$ of the carrier is proportional to the modulation signal m(t), while the instantaneous phase $\phi(t)$ is a time integral of the instantaneous frequency deviation $\delta\omega(t)$.

Because the argument $\phi(t)$ of the FM waveform represents a time integral of the modulation signal m(t), it follows that demodulation of an FM signal is a reverse process, where a derivative of the FM argument with respect to time contains the demodulated information:

$$BB(t) = k\varphi'(t) = k\frac{d}{dt}[\varphi(t)] = k\frac{d}{dt}\left[k_v \int m(t)dt\right] = k \cdot k_V \cdot m(t) \quad (2)$$

where BB(t) is a demodulated FM baseband signal, equal (within a constant $k \cdot k_v$) to the modulation signal m(t); k is a constant of proportionality in the demodulator and $k_v$ is a constant of proportionality in the modulator.

From equation (2) it follows that in order to demodulate an FM waveform, a demodulator must involve the operation of differentiating the argument of the FM waveform with respect to time. Different types of FM demodulators differ from each other in the manner in which this function is accomplished. In general, the differentiation of the argument of FM waveform can be accomplished by hardware, by digitization & computation (i.e. by Digital Signal Processing—DSP) or by the combination of the two.

In the computational approach, instantaneous samples of the argument of the FM signal are obtained (at a sampling rate equal or higher than the Nyquist rate), the samples are digitized and the time derivative is computed, yielding demodulated information. This approach is limited to lower FM carrier frequencies, where the limitation is imposed by analog to digital converters (ADC) speed, as well as by the computational speed. The ADC speed limitation problem can be overcome to some extent by "undersampling" (i.e. where the sampling rate is lower than the FM carrier frequency, but higher than twice the maximum modulation frequency). In a combined approach, the FM signal can be down-converted to lower frequencies, or to zero intermediate frequency (IF), and then sampled and computationally processed.

The hardware approach to differentiating the argument of the FM waveform usually involves an approximation of this operation, implemented in hardware. Most hardware methods utilize, in one form or another, a mathematical approximation described below:

Starting with a definition of a first derivative of a function:

$$\varphi'(t) = \frac{d\varphi(t)}{dt} = \frac{\varphi(t)-\varphi(t-dt)}{dt} \quad (3)$$

and multiplying eq. (3) by dt, the following expression is obtained:

$$\phi(t)-\phi(t-dt)=\phi'(t) \cdot dt \quad (4)$$

The dt is infinitesimally small increment of time. It can be approximated with a finite value of time, for example with a finite time delay τ, provided that this time delay is small compared with the maximum rate of change of signal φ(t), i.e. τ<<1/θmax, where ƒmax is the highest frequency in the baseband modulation signal.

Approximating dt~τ in equation (4):

$$\phi(t)-\phi(t-\tau)\cong\tau\cdot\phi'(t) \quad (5)$$

From equation (2), substituting k=τ, it directly follows that eq. (5) represents a demodulated baseband signal:

$$BB(t)=\tau\phi'(t)=\phi(t)-\phi(t-\tau)=k\cdot k_v\cdot m(t) \quad (6)$$

Equation (6) summarizes the outcome of the above approximate differentiation process. It states that the demodulated baseband signal can be obtained by finding a difference of the instantaneous phase of the FM waveform in the point of time t and in a delayed point of time t−τ.

To determine how small a time delay r needs to be in respect to maximum frequency of the modulation signal ƒmax, a Laplace transform of equation (5) can be used. Applying the Laplace transform to the left hand side of eq. (5) yields:

$$L[\phi(t)-\phi(t-\tau)]=L[\phi(t)]-L[\phi(t-\tau)]=\Phi(s)-\Phi(s)\cdot e^{-\tau s}=\Phi(s)(1-e^{-\tau s}) \quad (7)$$

where Φ(s) is a Laplace transform of φ(t) and s is a complex frequency variable $$s=\sigma+j\omega.$$

Approximating $e^{-\tau s}$ with a Taylor expansion around zero:

$$e^{-\tau s} \cong 1 - \tau s + \frac{(\tau s)^2}{2} \quad (8)$$

From eq. (8):

$$1 - e^{-\tau s} \cong \tau s - \frac{(\tau s)^2}{2} = \left(1 - \frac{\tau s}{2}\right)\tau s \quad (9)$$

and substituting eq. (9) in eq. (7):

$$L[\varphi(t) - \varphi(t-\tau)] \cong \left(1 - \frac{\tau s}{2}\right)\tau s \Phi(s) \quad (10)$$

Eq. (10) represents the Laplace transform of the left-hand side of eq. (5). Comparing this equation with the Laplace transform of the right hand side of eq. (5):

$$L[\tau\phi(t)']=\tau s\Phi(s) \quad (11)$$

it follows that the two sides of eq. (5) are equal, provided that $$\frac{\tau s}{2} << 1 \quad (12)$$

This term represents the error (or distortion) caused by the approximation dt~τ. For instance, if s=$\omega_{max}$ (highest modulation frequency), and allowing for 1% (0.01) distortion in the demodulated signal, the maximum acceptable delay can be computed from eq. (13):

$$\frac{\tau\omega_{max}}{2} \le 0.01 \Rightarrow \tau << \frac{0.02}{\omega_{max}} = \frac{0.02}{2\pi f_{max}} = \frac{0.01}{\pi f_{max}} \quad (13)$$

Audio FM demodulator example: ƒmax=20 kHz and from eq. (13) it follows that the maximum acceptable delay for 1% distortion is:

$$\tau_{max} \le \frac{0.01}{\pi \cdot 20 \text{ kHz}} = 0.16 \text{ μs} \quad (13a)$$

A widely used hardware implementation utilizing time delay per the concept above is a well known quadrature FM demodulator of the related art, illustrated in FIG. 1. The modulated FM signal 10 is split two ways, one passed without delay and the other passed through a delay circuit 2 having a delay τ. The phase shift of the delayed arm is adjusted for 90° at FM carrier center frequency. The relative phases of the two arms are then compared in a phase comparator or phase detector 4, at the output of which, after passing through low-pass filter 6, demodulated baseband signal BB(t) is obtained.

The output 8 of the demodulator of FIG. 1, considering fundamental frequency terms only, can be expressed as:

$$BB(t)=FM(t)\cdot FM(t-\tau)=\cos[\omega_c(t+\phi(t)]\cdot\cos[\omega_c(t-\tau)+\phi(t-\tau)] \quad (14)$$

Using a trigonometric identity for product of two cosines:

$$\cos A \cdot \cos B \cdot = \frac{1}{2}\cos(A-B) + \frac{1}{2}\cos(A+B) \quad (15)$$

and applying identity (15) to equation (14):

$$BB(t) = \quad (16)$$
$$\frac{1}{2}\cos[\varphi(t) - \varphi(t-\tau) + \omega_c\tau] + \frac{1}{2}\cos[2\omega_c t - \omega_c\tau + \varphi(t) + \varphi(t-\tau)]$$

The low pass filter (LPF) 6 at the output of the mixer removes the sum frequency and all higher frequency terms, and for $\omega_c\tau$=−90° (or odd multiples of 90') at the carrier frequency $\omega_c$, the output is:

$$BB(t) = \frac{1}{2}\cos[\varphi(t) - \varphi(t-\tau) - 90°] = \frac{1}{2}\sin[\varphi(t) - \varphi(t-\tau)] \quad (17)$$

Substituting φ(t)−φ(t−τ) with τφ'(t) from eq. (5):

$$BB(t) \cong \frac{1}{2}\sin[\tau\varphi'(t)] \quad (18)$$

and substituting φ'(t)=$k_v$m(t) from eq. (1):

$$BB(t) \cong \frac{1}{2}\sin[\tau k_v m(t)] \quad (19)$$

Using small angle approximation of sine function:

$$\sin x \cong x \text{ for small } x \text{ } (x<<1 \text{ radian}) \quad (20)$$

Applying approximation (20) to equation (19):

$$BB(t) \cong \frac{1}{2}\tau k_v m(t) \text{-Demodulated signal at output 8} \quad (21)$$

Equation (21) represents a demodulated signal in the FM demodulator of the related art. In this type of demodulator, delay τ is obtained with a tuned circuit (either with single or double tuned LC circuit, or with ceramic resonators). The delay must be small enough to achieve low distortion, per eq. (13). Furthermore, the delay must also produce a quadrature phase shift (90°) at the center frequency $\omega_c$ (if the phase delay is not exactly 90°, the demod would still work, but at reduced performance).

The specific requirement for phase quadrature imposes a practical limit for the use of this demod to a fixed frequency. At that fixed center carrier frequency, the circuit is adjusted for a precise 90° phase shift. An application example of this type of demod at fixed frequency is in FM stereo receivers. They use an IF frequency of 10.7 MHz, where a fixed tuned circuit (either a single tuned LC circuit, or a double tuned LC circuit with coupled coils) is used to obtain 90° phase shift at that frequency.

The problem of using this type of demodulator in frequency agile applications comes from the difficulty in achieving flat group delay and maintaining a 90° phase shift over broader range of carrier frequencies $\omega_c$. Furthermore, this solution is not suitable for integration into integrated circuits (ICs), due to difficulties in implementing a required time delay and phase shift inside the integrated circuit.

Frequency agility has been resolved in another type of demodulator of the prior art, shown in FIG. 2. Instead of splitting and delaying the FM signal before the phase detector, as in the demodulator of FIG. 1, the FM signal 12 is first down-converted to zero IF frequency and then delayed, prior to phase comparison. In this type of demodulator, the FM signal 12 with carrier frequency $\omega_c$ is split in two in-phase signals 14 and 16, and each signal is down-converted to zero IF frequency by mixing it with local oscillator (LO) 26 of frequency coo One of the in-phase signals (14) is mixed with zero phase LO signal 32 in mixer 18, producing the in-phase (I) output 22, while the other in-phase signal (16) is mixed with quadrature phase (−90°) LO signal 30 in mixer 20, producing quadrature (Q) output 24. The mixing process produces two sidebands—the lower sideband (LSB) having the difference frequency $\omega_c - \omega_0$ and the upper sideband (USB) having the sum frequency are $\omega_c + \omega_0$, i.e. this mixing results in a double sideband (DSB) conversion. Each of the I and Q arms at the output of respective mixers contains DSB signals: the sum of the LSB and the USB components, as shown in FIG. 2, where the sign "−" designates the LSB sideband (I⁻or Q⁻) and "+" designates the USB sideband (I⁺or Q⁺).

For further processing, it is necessary to remove the undesired USB components from both arms. The low pass filter (LPF) 34 in I arm and LPF 36 in Q arm are used to accomplish this task: the upper sidebands are filtered out and desired lower sidebands I⁻(38) and Q⁻(40) at difference frequency $\omega_c - \omega_0$ are extracted. Both I arm 38 and Q arm 40 at the output of LPF filters are split two ways, one way delayed by X (in delay circuit 42 for I arm and in 44 for Q arm) and the other way not delayed. Next, the cross-mixing of two pairs of signals follows (38 and 48 in mixer 52, and 40 and 46 in mixer 50). The summation, with the proper sign in the summing circuit 58 of the products 54 and 56 thereof is conducted, yielding baseband output 60 per equations below:

$$BB(t) = I^-(t-\tau)\cdot Q^-(t) - I^-(t)\cdot Q^-(t-\tau) \quad (22)$$

By substituting individual terms with respective trigonometric expressions and expanding eq. (22), it can be shown that the BB signal 60 at the output of FIG. 2 is equal to:

$$BB(t) = \frac{1}{4}\sin[(\omega_c - \omega_0)\tau + \varphi(t) - \varphi(t-\tau)] \quad (23)$$

The LO frequency $\omega_0$ does not need to be equal (or phase locked) to the FM carrier frequency $\omega_c$; however, it needs to be close enough, so that the difference frequency $\omega_c - \omega_0$ is around zero (zero IF) and all modulation sidebands fall within the pass-band of the LPF filter. Conversely, the LPF bandwidth needs to be high enough to pass the highest frequency of interest. In eq. (23) it is necessary to keep the argument small in order to achieve linear demodulation, in accordance with the to small angle approximation of sin x≅x in eq. (20). This condition is met for $(\omega_c - \omega_0)\tau = $, i.e. $\omega_0 \cong \omega_c$. Using equations (17) through (20), the demodulated signal 60 at the output of FIG. 2 can be expressed with the following equation:

$$BB(t) \cong \frac{1}{4}\tau k_v m(t) \quad (24)$$

which is identical to eq. (21), except for a reduced level (by a factor of two).

While the solution of FIG. 2 resolves the frequency agility issue, it is still not suitable for integration into integrated circuits (ICs), due to difficulties in implementing low pass filters inside the ICs. Thus, external filters would have to be used, which would require a signal to exit the IC for external filtering, pass through a filter (the signal will at this point become an analog signal) and in the case of digital Ics, re-entry into the IC will be required through some type of a comparator that will convert the analog signal back to digital.

Also, the performance of the prior art circuit directly depends on the phase and amplitude balance of the LPFs 34 and 36 in the I and Q arms. Any amplitude and/or phase imbalance in the two paths 38 and 40 will cause degradation of the quality of the demodulated signal (i.e. the noise and distortion performance will degrade). This places additional burden on low pass filter design and implementation for the prior art.

Thus, considering the limitations of both frequency discrimination and frequency demodulation of the prior art, those of skill in the art will recognize the need for 1) an alternative solution for frequency discrimination, one that can operate at much higher comparison frequencies for application to frequency synthesizers, thereby substantially improving phase noise performance, and 2) an alternative solution for demodulation for application to FM demodulation, one that facilitates frequency agile operation, is simple in design and suitable for implementation in integrated circuits.

SUMMARY OF THE INVENTION

It is therefore an objective of the present invention to provide frequency discriminators or frequency comparators, having inherently faster topologies, that can operate at high comparison frequencies (i.e. on the order of 200 MHz for digital circuit implementation, consistent with the current state of the art in digital integrated circuits technology, but inherently not limited to this operating frequency, or in the GHz range with analog/RF integrated circuits), suitable for use in frequency synthesizer applications, requiring high comparison frequencies.

It is another objective of the present invention to provide FM demodulators which are frequency agile (i.e. tunable over a wide frequency range) and that can operate at high frequencies (same as in the first objective above), and suitable for use in FM receivers and similar applications.

It is further an objective of the present invention to utilize bi-level (digital) circuits to accomplish all functions, or, in the cases where it is not feasible due to the speed (i.e. utilize frequency) limitations of the current state of the art digital integrated circuit technology, use the combination of analog radio frequency (RF) and digital circuits in one embodiment of the invention, where analog functions can be implemented by using standard analog/RF integrated circuits, and digital functions can be implemented in any type of programmable logic devices (PLD), Field Programmable Gate Arrays (FPGA), or custom Application Specific Integrated Circuit (ASIC).

It is another objective to embody the present invention in a form suitable for integration on a single chip integrated circuit, with minimum required support circuitry, either digital-only IC, or as a mixed signal analog/digital IC.

It is yet another objective to provide in-circuit capability to control the operating frequency and/or time delay in the case of the frequency discriminator application, to set the FD operating frequency range and gain (Volts/Hz), where the gain can be set to much higher if levels, or, in the case of FM demod applications, to adjust the gain of the FM demodulator.

It is yet another objective to allow a system design, where a PLL could be made to lock on an offset frequency, which differs from the reference frequency by an exact amount controlled by the design.

It is another objective of the present invention to provide an FD, which, in combination with an XOR phase detector and an appropriate switching mechanism will provide a less noisy PFD solution for low phase-noise PLL applications.

These and other objectives in the present invention are achieved by the complex SSB down-conversion to zero IF frequency and by other means, which will be clear to those of skill in the art in view of the detailed description of the invention.

DETAILED DESCRIPTION OF THE INVENTION

Figure 2:
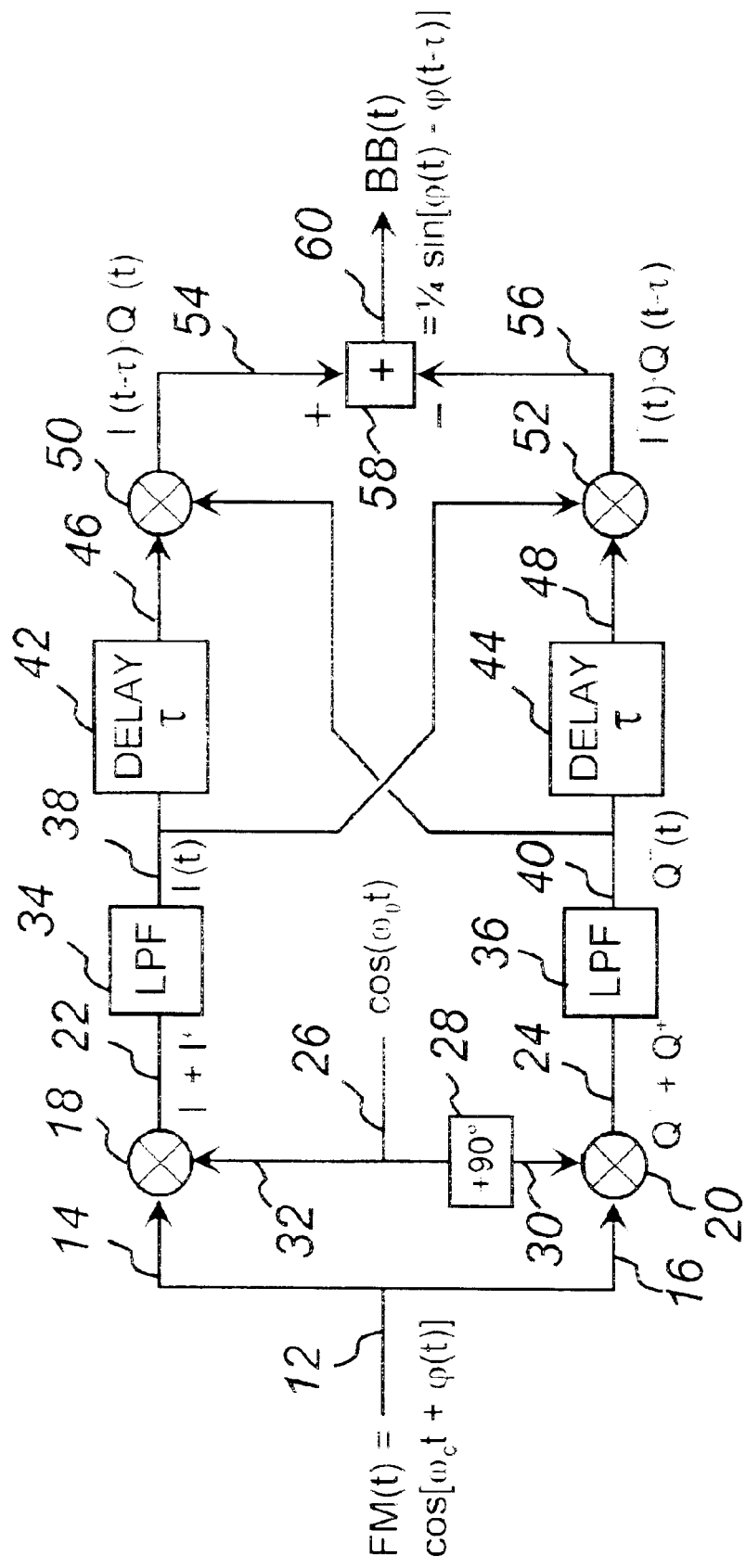
FIG. 2 is an illustration of the functional block diagram of an FM demodulator of the prior art, using complex double side-band (DSB) conversion to zero IF, where both in-phase (I) and quadrature (Q) down-conversion of FM signal to zero IF is utilized. Low pass filters for removal of upper sidebands at zero IF at both I and Q arms are necessary.
Figure 3:
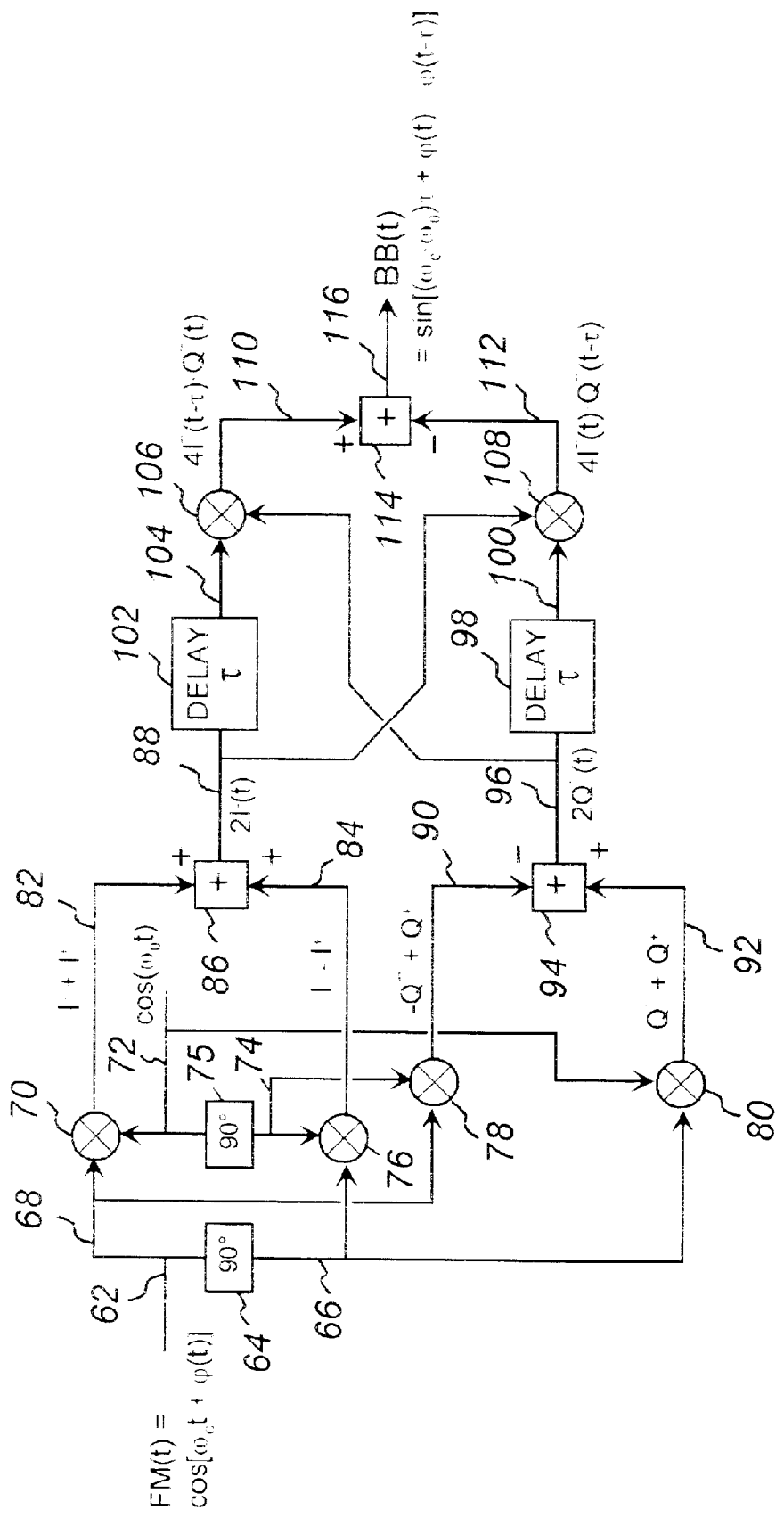
FIG. 3 is an illustration of the functional block diagram of one embodiment of the frequency discriminator and/or FM demodulator of the present invention, using complex single side-band (SSB) conversion to zero IF, where I and Q mixing of both in-phase and quadrature components of FM signal is utilized. Only one (lower) sideband at zero IF at each I and Q arms is produced. Low pass filtering for removing of the other (upper) sideband is not required in this embodiment.

To overcome the problem encountered in the prior art in FIG. 2 of having to filter with low pass filters both the I and Q arms, a complex single side-band (SSB) down-conversion to zero IF using in-phase (I) and quadrature signal (Q) shifted by 90° can be used, as shown in one embodiment of the demodulator of the present invention in FIG. 3. The SSB mixing (also known as image rejection mixing) of two frequencies produces only one dominant frequency, equal to either the sum or the difference of the two frequencies, depending upon which sideband (upper or lower) is produced, which in turn is the function of the phasing of the quadrature components of the two frequencies. The complex SSB down-converter used in the present invention utilizes two sets of SSB mixers—one to produce the in-phase LSB signal, and the other to produce the quadrature LSB signal.

For complex SSB mixing, quadrature signals (0° and 90° phase signals) of both FM and LO signals are required. To obtain the phase shift of −90° necessary for quadrature signals 66 and 74, either a delay line having a delay equal to 90° phase shift at the operating frequency (which is not inherently broad-band, since a phase shift of a delay line will vary with frequency of the signal), or a divide-by-two or divide-by-four divider circuit can be used, as shown later in some of the embodiments of this invention.

In FIG. 3, the LO signal 72 is split into in-phase signals providing the LO drive for two mixers 70 and 80, and into quadrature signal 74 providing the LO drive for another two mixers 76 and 78. The FM signal 62 is also split into in-phase signal 68 feeding mixers 70 and 78, and quadrature signal 66 feeding mixers 76 and 80. Each mixer 70, 76, 78 and 80 produces DSB signals at its respective output, as a sum or a difference of its respective LSB and USB components, as indicated in lines 82, 84, 90 and 96 in FIG. 3.

Both the in-phase output 88 and the quadrature output 96 of the complex SSB mixer of FIG. 3 will contain only one sideband, either the lower sideband (LSB) or the upper sideband (USB), depending whether the phase of the quadrature component leads or lags the in-phase signal, and depending upon the sign of the adding circuit. In this application, the phasing is chosen for LSB sidebands: the output 82 of mixer 70 is combined (added) with output 84 of mixer 76 in a summing circuit 86, producing the in-phase baseband LSB signal 88. The output 90 of mixer 78 is combined (subtracted) with output 92 of mixer 80 in a summing circuit 94, producing the quadrature baseband LSB signal 96.

The output 88 of the in-phase arm of the complex SSB mixer can be expressed as:

$$(I^{+}+I^{+})+(I^{-}-I^{+})=2I^{-}(t)=\cos[(\omega_c-\omega_0)t+\phi(t)] \quad (25)$$

Similarly, the output 96 of the quadrature arm can be expressed as:

$$(Q^{-}+Q^{+})-(-Q^{-}+Q^{+})=2Q^{-}(t)=\cos[(\omega_c-\omega_0)t+\phi(t)-90°] \quad (26)$$

Delaying each arm by $\tau$, generating the cross product signals 110 in mixer 106 and 112 in mixer 108, and subtracting these terms in the summing circuit 114:

$$BB(t)=4I^{-}(t-\tau) \cdot Q^{-}(t)-4I^{-}(t) \cdot Q^{-}(t-\tau) \quad (27)$$

Substituting eq. (25) and (26), and (t−τ) for t in eq. (27), and expanding individual terms, the demodulated signal 116 at the output can be computed:

$$BB(t)=\sin[(\omega_c-\omega_0)\tau+\phi(t)-\phi(t-\tau)] \quad (28)$$

which is the same as equation (23), except with 4 times (or 12 dB) higher signal level.

In demodulator applications, $(\omega_c-\omega_0)\tau=0°$ (or multiples of 180°), and the demodulated signal from eq. (28) is:

$$BB(t)=\sin[\phi(t)-\phi(t-\tau)]\approx \tau k_v m(t) \quad (29)$$

In discriminator applications, $\phi(t)=0$, and the output (DC error) signal from eq. (28) is:

$$DC=\sin[(\omega_c-\omega_0)\tau] \quad (30)$$

Figure 5:
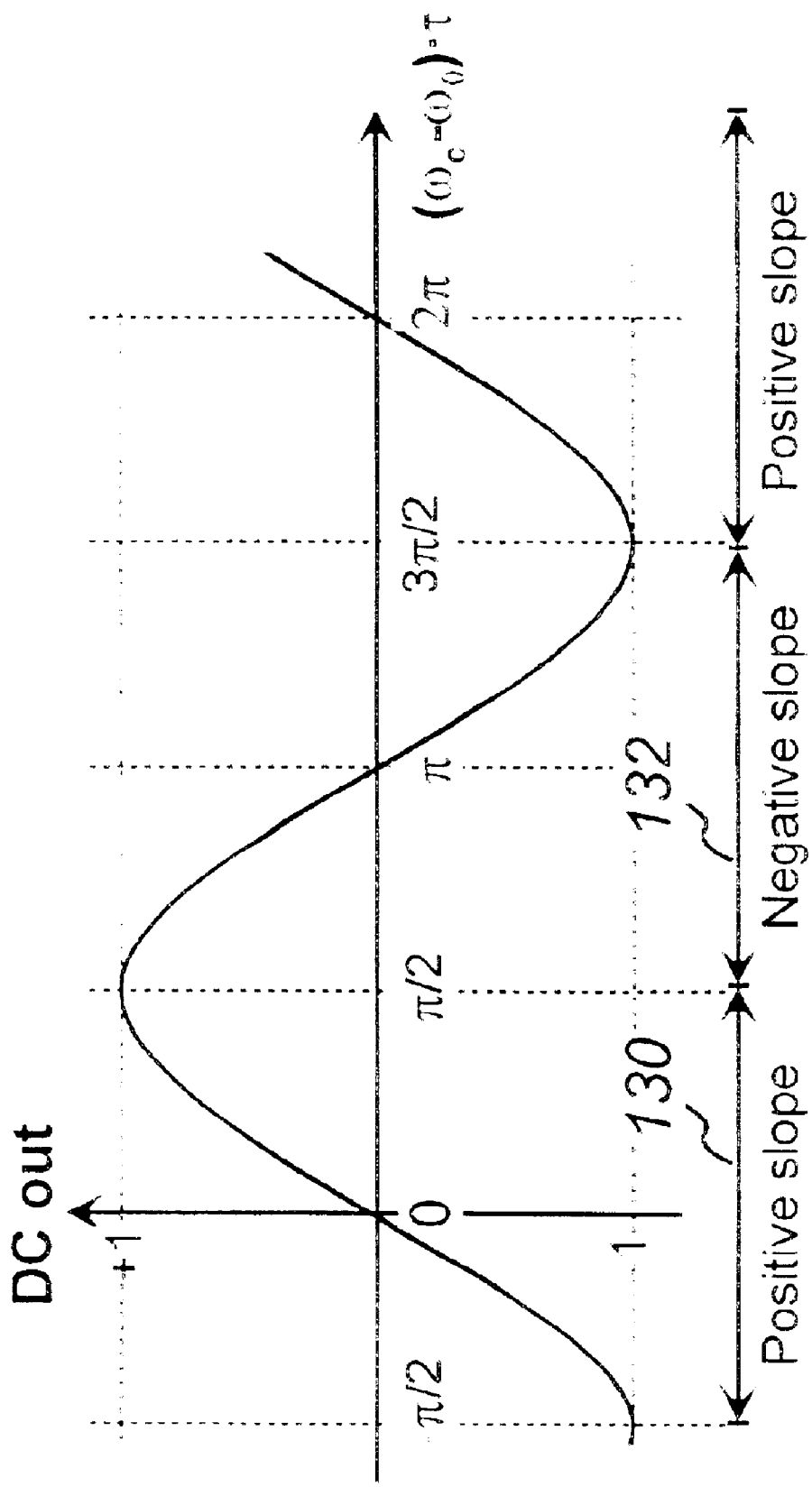
FIG. 5 is a plot of a discriminator output error function $\sin(\omega_c - \omega_0)\tau$, illustrating the polarity (sense) of this function as a function of the value of the argument, which is important to consider in frequency discriminator applications.

A plot of the discriminator output DC error function $\sin(\omega_c-\omega_0)\tau$ of equation (30) is shown in FIG. 5. The plot illustrates the polarity (sense) of this function as a function of the value of the argument. For arguments between −90° and +90° (argument range 130 in FIG. 5), the sense of the error function is positive. For arguments between 90° and +270° (argument range 132), the sense of the error function is negative. The sense alternates from positive to negative in 180° intervals. This is important to consider in frequency discriminator applications, because the alternating polarity of the error function limits the frequency range for discriminators. Limiting the argument of eq. (30) to $\pm\pi/2$, it can be seen that the frequency range limit is in the order of $\frac{1}{2}\tau$. For instance, if the delay is 50 ns, the discriminator frequency range is 10 MHz. The frequency range can be extended beyond this limit by changing (i.e. programming) the time delay $\tau$. This will be discussed further, in conjunction with some of the embodiments of the frequency discriminators of this invention.

Figure 4:
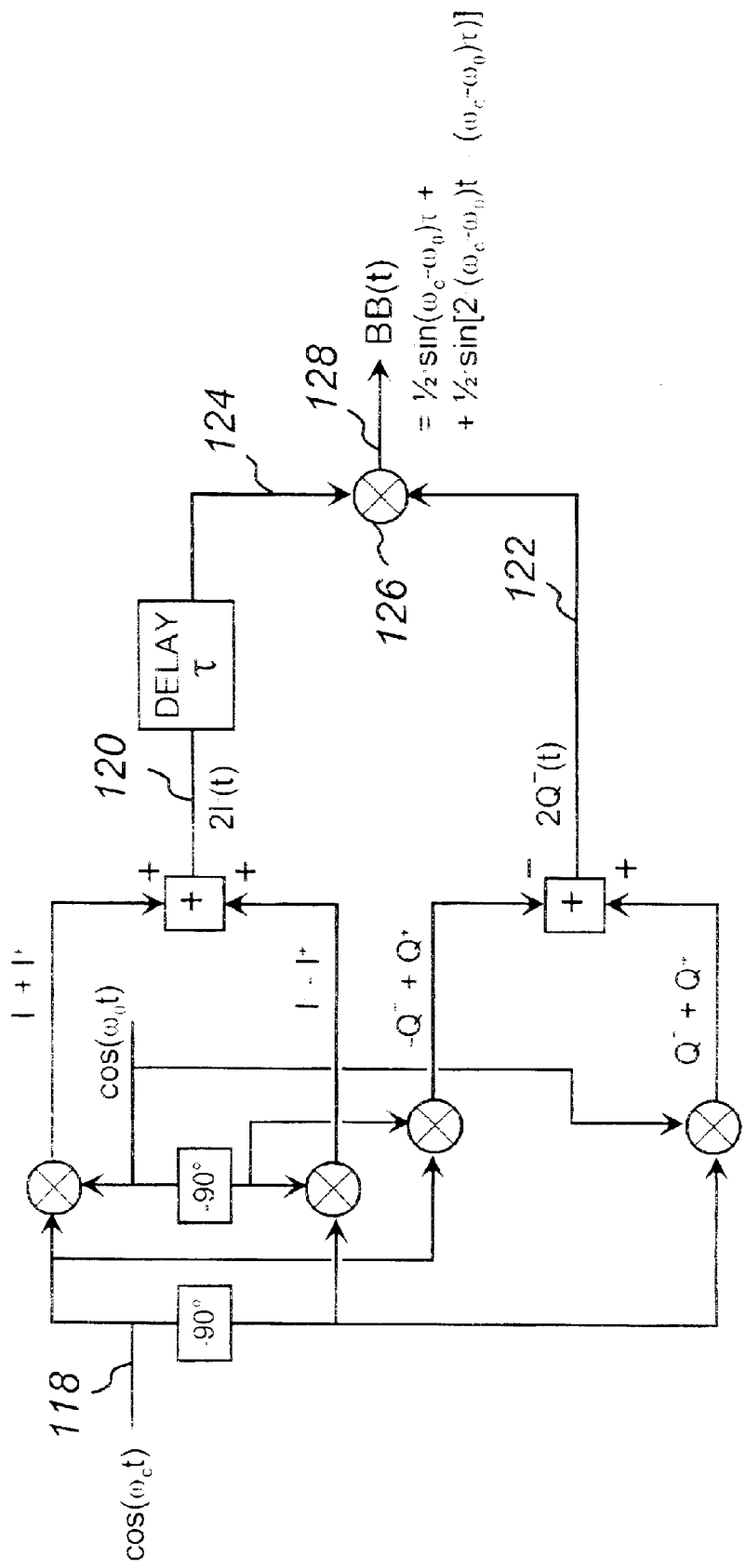
FIG. 4 is an illustration of a simplified embodiment of the present invention utilizing complex SSB conversion to zero IF, but with reduced complexity at the expense of somewhat reduced performance in frequency discriminator applications.

In some frequency discriminator applications, a simplified embodiment of the present invention, shown in FIG. 4, can be used. This embodiment also utilizes the complex SSB conversion to zero IF, but with reduced complexity at the expense of somewhat reduced performance. Here, only one delay circuit in the in-phase arm 120 is used. The quadrature signal 122 is multiplied with a delayed in-phase signal 124 in mixer 126, to produce output 128:

$$BB(t)=\frac{1}{2}\sin[(\omega_c-\omega_o)\tau]+\frac{1}{2}\sin[2(\omega_c-\omega_o)t-(\omega_c-\omega_o)\tau] \quad (31)$$

The first part of eq. (31) contains a DC term, while the second part is a slow varying sine-wave signal. When the frequency $\omega_c$ approaches $\omega_0$, equation (31) converges to zero, and the frequency discrimination function is achieved.

A phase detector or phase comparator is often realized as a multiplier or frequency mixer in analog implementation, or, for instance, as an XOR logic circuit in digital applications. The difference between a multiplier and a mixer is that in a multiplier both ports are linear, whereas in a mixer one port only is linear and the other port is highly nonlinear, acting as a signal limiter (or a signal clipper) and producing a square-wave (bi-level) switching signal (the limiting effectively converts an analog signal into a bi-level digital signal). In analog applications, the bi-level signal can have bipolar signal levels (e.g. +1 and −1), while in digital applications, the bi-level signal can assume only '0'and '1' logic levels, which are typically 0V and Vcc.

For FM demodulation, signals at both ports need to be limited, in order to eliminate any amplitude modulation (AM) or amplitude noise that may be present on the signal. The removal of AM modulation is necessary in order to prevent possible degradation of the FM demodulated signal due to amplitude attributes of the FM signal. The limiting of a signal is a non-linear operation, which generates harmonics of the signal. It can be shown that primarily odd order harmonics are generated ($3^{rd}$, $5^{th}$, etc.), because limiting produces an odd mathematical function (limiting is usually symmetrical in respect to signal polarity (i.e. the signal peaks and valleys are equally limited). The limiting can be performed with dedicated limiter circuits, but is usually accomplished by the multiplier/mixer itself, when provided with high enough signal levels.

As a consequence of harmonic generation due to limiting, the output of any of the above mentioned phase detectors will contain, in addition to the product of the two fundamental frequencies, also a product of all harmonic frequencies of the two signals. This is because the phase detector performs the operation of multiplying of the two signals in the time domain, which is equivalent to the operation of frequency mixing in the frequency domain (i.e. the output spectrum is equal to the convolution of the spectra of the two input signals). In general, all these spectral terms should be considered in an analysis of the FM demodulator. However, the analysis of the only fundamental terms is usually sufficient, as discussed below.

Phase detectors 106 and 108 in FIG. 3, depending on the implementation, will either receive already limited input signals or will perform the limiting of the respective input signals. These limited signals contain the fundamental frequency $\omega_c$, as well as harmonic frequencies $n \cdot \omega_c$ where n is the harmonic number. All of these frequency terms will participate in the mixing process and will produce some energy at the output of the mixer. The mixing of the fundamental frequencies will produce the dominant, desired term. The harmonics present at both mixer ports will beat with each other and produce numerous terms. The sum frequency terms will be low pass filtered, and the difference terms will produce low frequency terms. It can be shown that these identical low frequency terms produced by harmonic mixing contain the same signals to the desired terms, except with much lower amplitude. The amplitudes of the harmonic mixing terms are attenuated at the rate proportional to the square of the harmonic number $n^2$. As an example, the third harmonic, which is typically the strongest one after the fundamental, is attenuated by $20\log 3^2 = 19$ dB. It will contribute to the level of the desired signal by $\frac{1}{3}^2 = 0.11$, or 11%. The harmonic product terms will be added or subtracted from the desired term and will affect only the demodulated output signal level, or the demodulator gain, and therefore a simplified analysis of only the fundamental frequency products is usually accurate enough.

Figure 7:
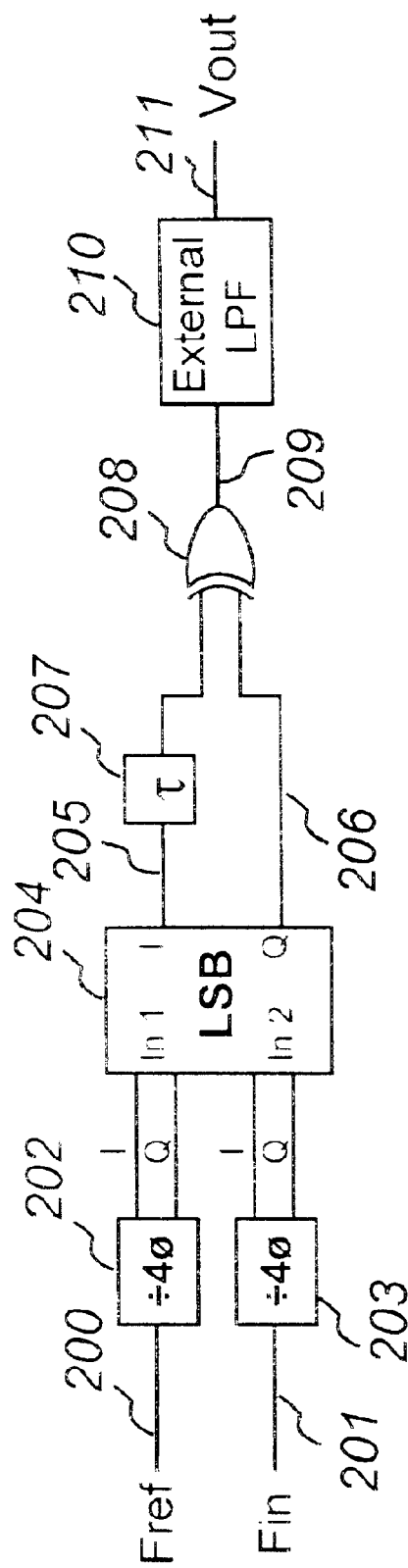
FIG. 7 depicts the block diagram of one embodiment of the present invention of a bi-level Frequency Discriminator (FD).

A digital bi-level implementation as utilized in one embodiment of the present invention shown in FIG. 7, is now considered. Here, a bi-level frequency discriminator is presented using complex single side-band conversion to zero IF, which is free of the speed constraints associated with the prior art flip-flop based FDs, and is therefore capable of handling much higher frequencies. In addition, its gain can be dynamically controlled in-circuit and traded-off with its frequency range, to better suit the circuit needs. This FD needs to be combined (or switched) with a fast PD in order to accomplish a complete PFD function of both frequency acquisition and phase comparison.

When two square-wave signals are applied to the FD depicted in FIG. 7, the resulting waveform at the output 211 will be a train of pulses consisting mainly of three spectral components: the difference of the two frequencies, twice that difference, and a DC component that is basically defined by the duty cycle of this waveform. After passing through an external low-pass filter 210, only the DC component remains, which is proportional to the frequency difference $\Delta F$ between the two inputs $F_{in}$ (201) and $F_{ref}$ (200). The transfer function of the FD, expressed in [Volt/Hertz], is linear and is defined here to range between $(F_{ref}-F_{max})$ to $(F_{ref}+F_{max})$. Beyond those limits the slope changes its sign, and $2 \cdot F_{max}$ past those limits it changes again, and so on, producing a periodic triangular transfer function with a period of $[4 \cdot F_{max}]$.

Figure 12:
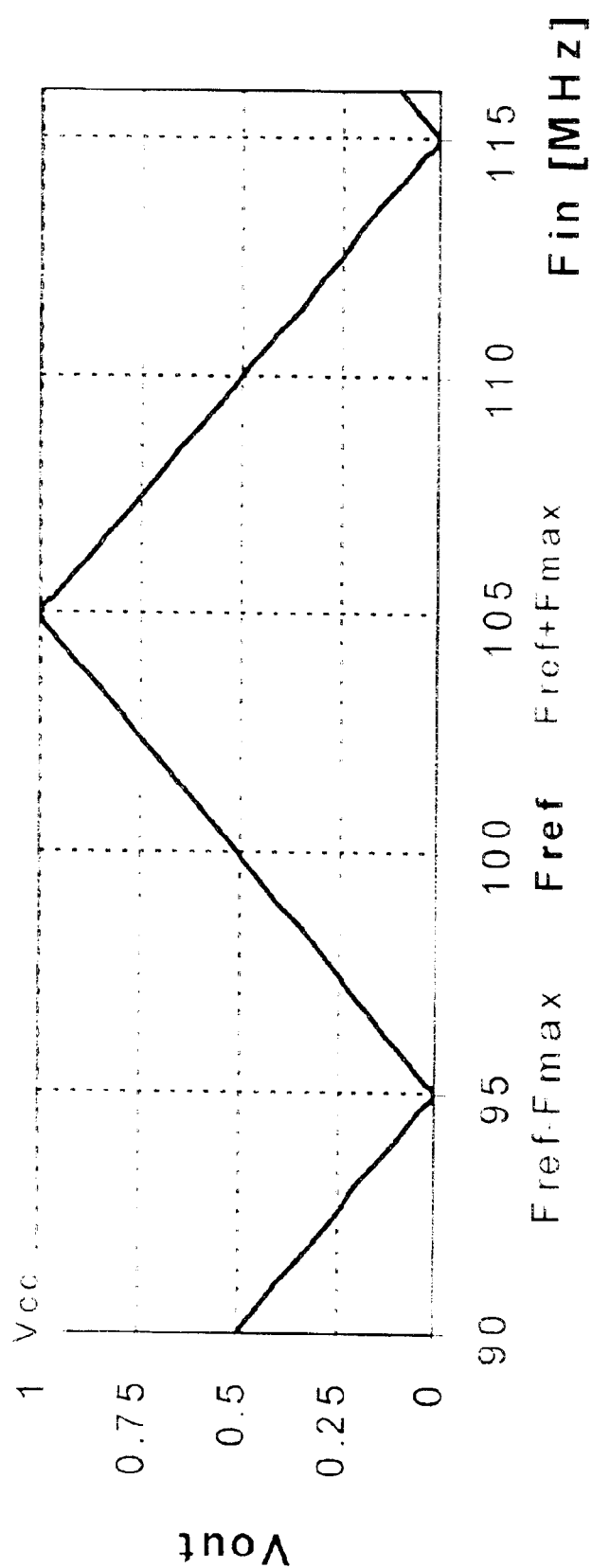
FIG. 12 depicts the transfer function of the FD of FIG. 11, with an example of Fref=100 MHz, and an operating range of ±5 MHz around it.

FIG. 12 shows an example of an ideal transfer function of an FD designed to operate in the range of 95 MHz to 105 MHz: $F_{ref}=100$ MHz, and $F_{max}=5$ MHz. When the input $\Delta F$ is positive, Vout 211 is proportionally greater than ½ Vcc, and when $\Delta F$ is negative, Vout 211 drops below ½ Vcc. Half Vcc is thus the midpoint of the FD output transfer function. This FD circuit however, suffers from two minor problems. The first problem is that the output, in addition to the desired DC content, includes a component of the "beat" frequency $(F_{ref}-F_{in})$, as well as a component of twice the "beat" frequency: $2 \cdot (F_{ref}-F_{in})$. This might slightly affect the transfer function's linearity. The second problem is that around the region of frequency equality there is some instability that can be explained by the fact that when the two frequencies $F_{ref}$ and $F_{in}$ are equal the output AC components (i.e. the "beat" and twice the "beat" frequency) will both be 0 Hz so the output will get stuck to either one of the logic states '0' or '1', and thus not resulting in the ideal ½ Vcc will not be achieved.

Figure 8:
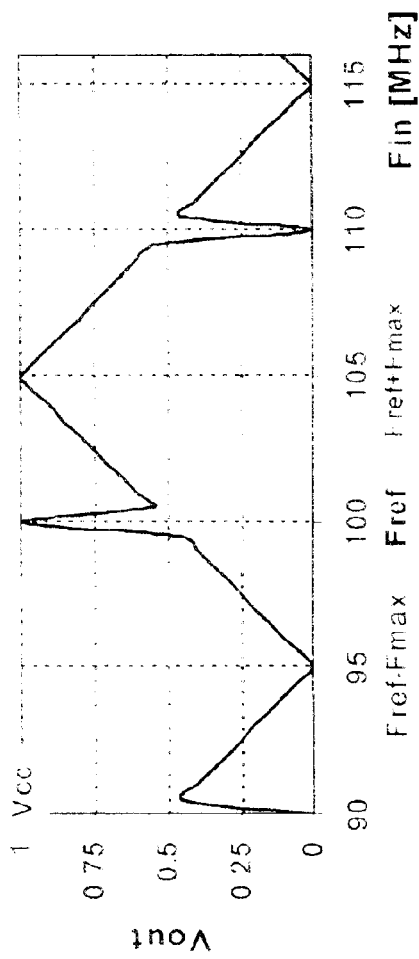
FIG. 8 depicts the transfer function of the FD embodiment of FIG. 7, with an example of Fref=100 MHz, and an operating range of ±5 MHz around it.

This transfer function artifact is shown in FIG. 8. The solution to both problems lies in an improved variation of the FD which is herein discussed as yet another embodiment of the present invention, exhibiting a thoroughly continuous and linear transfer function as shown in FIG. 12. This circuit depicted in FIG. 11, also using complex single side-band conversion to zero IF, processes the input signals 212 and 213 in the same fashion through an LSB block 215 as in the earlier FD shown in FIG. 7. The difference is that here it is split in two sections at the output of the LSB block 215. The top section consisting of delay 216 and XOR 218 is identical to the previous FD. The bottom section consisting of delay 217 and inverting-XOR 219 has the delay 217 off the Q output rather than off the 'I' output of 215, and also the gate 219 is an inverting-XOR. Those two section outputs 223 and 224 get externally summed together prior to the final low-pass filter 221. These incremental modifications achieve the following two things: first the "twice beat frequency" component of $2 \cdot (F_{ref}-F_{in})$ gets effectively cancelled for overall improved linearity of the transfer function as shown in FIG. 12. Secondly, it solves the other problem described for the earlier FD, that when the two input frequencies $F_{ref}$ and $F_{in}$ are equal the output gets stuck at either one of the logic states '0' or '1'. With this new topology when the "beat" frequency is zero, output 223 will get stuck at whatever logic state '0' or '1', while the other output 224 is guaranteed to get stuck to its complementary logic state. Therefore, after the signal summation at 220, the DC content will always be correct at ½ Vcc.

Figure 11:
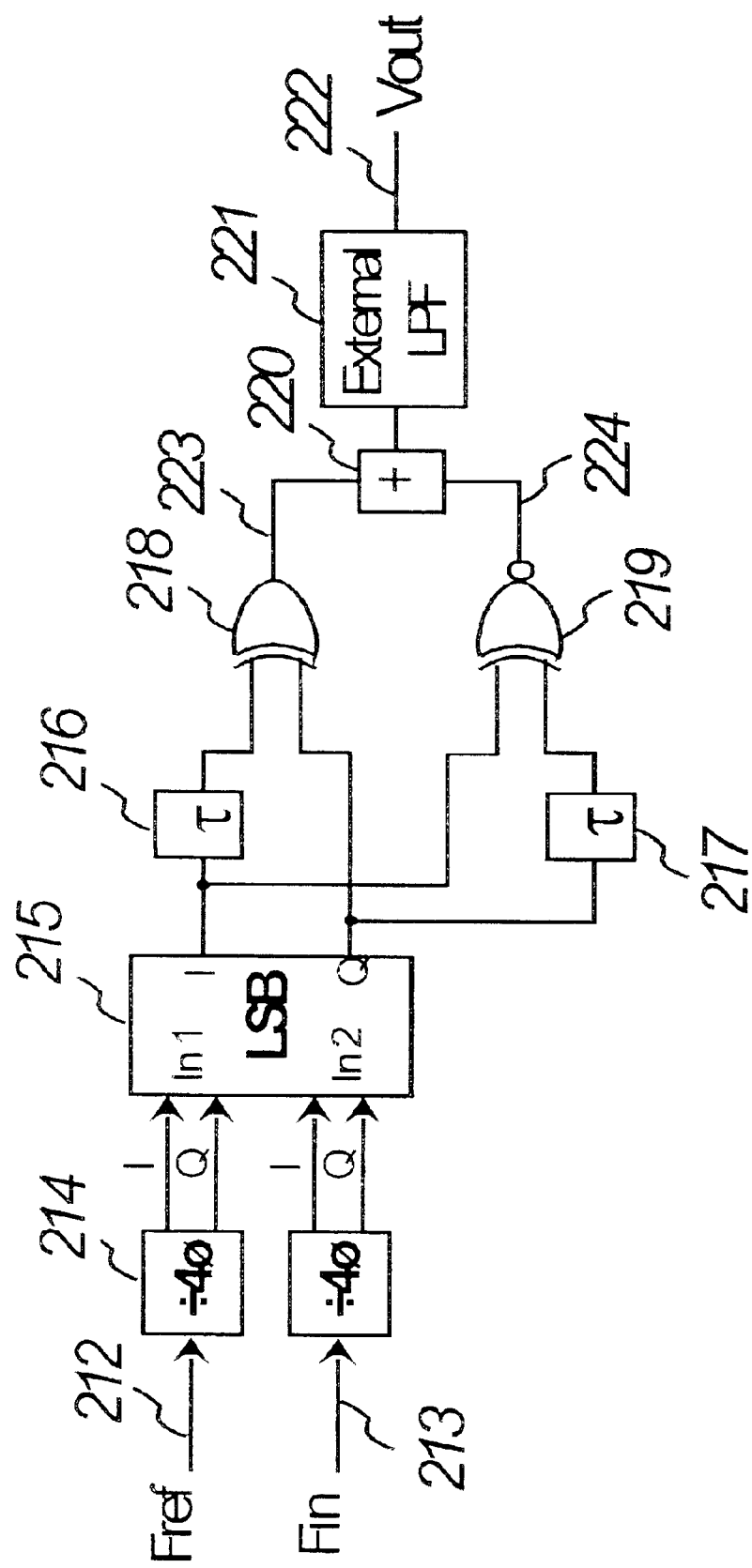

The following explanation will first describe the simple circuit of FIG. 7, because the more complete circuit of FIG. 11 is one including the complementary summation of two sections similar to FIG. 7. The operation of the bi-level FD is based on complex single side-band mixing of two input signals to extract the difference in frequency between them while suppressing their sum (lower side band only, or LSB). This LSB process is done in block 204 having two outputs in quadrature phasing, I (205) and Q (206). Subsequently, output 205 only gets delayed with respect to its quadrature counterpart 206 by a fixed time $\tau$ (implemented in 207), and finally get mixed together by an exclusive-OR (XOR) element 208. To better understand the operation of such circuit let's take an example where two square waves of frequencies Fref and Fin are input at 200 and 201, and each get divided by four by blocks 202 and 203, producing ¼Fref and ¼Fin. Let's presume that the LSB block 204 generates two outputs 205 and 206 consisting of two equal square waves with quadrature phase relationship (90° phase shifted from each other) having a frequency of exactly the difference between what is presented at the LSB inputs. Let's refer here to this frequency difference generated by 204 as "¼$\Delta F$". For the purpose of this explanation let's assume for a moment that the delay 207 is set to zero ($\tau=0$). In this case, the multiplying element, a simple XOR gate 208, would output a waveform at twice that frequency ($2 \cdot \frac{1}{4}\Delta F = \frac{1}{2}\Delta F$) with 50% duty cycle. With this duty cycle the DC content of that waveform would be exactly ½ Vcc (Vcc being the upper rail voltage of the XOR gate 208). Because $\tau=0$, even if the input frequency changes, the quadrature phase relationship at 205 and 206 is always maintained and the output 209 would always be at 50% duty cycle no matter what the input frequency is. When the delay 207 is a fixed time other than zero: $\tau \neq 0$, then the phase difference $\Phi$ of the signals at the input to the XOR 208 would be the given quadrature (90°)

plus some other phase shift that is linearly proportional to the input frequency difference ¼ΔF:

$$\Phi = 90° + \tau \cdot \frac{1}{4} \Delta F \cdot 360°° = 90° + \tau \cdot \Delta F \cdot 90° \quad (42)$$

It is common knowledge that the DC output of any XOR gate whose inputs are square waves of the same frequency, and phase shifted with respect to each other by a degrees is:

$$V_{XOR} = V_{CC} \cdot \alpha/180° \quad |@0° \leq \alpha \leq 180° \quad (43)$$

$$V_{XOR} = Vcc \cdot (360° - \alpha)/180° |@180° < \alpha < 360°$$

Since this function is periodic over 3600, a needs to be defined here as being modulus 360°. Hence, thie eq. (43) basically describes a triangular function. When replacing $\Phi$ of eq. (42) with a of eq. (43) we get the FD output DC voltage 211:

$$Vout = Vcc \cdot (90° + \tau \cdot \Delta F \cdot 90°)/180° = \quad | \quad (44a)$$

$$= \frac{1}{2} Vcc \cdot (1 + \tau \cdot \Delta F) \quad |@-1 < \tau \cdot \Delta F \leq 1$$

$$Vout = Vcc \cdot (360° - 90° - \tau \cdot \Delta F \cdot 90°)/180° = \quad | \quad (44b)$$

$$= \frac{1}{2} Vcc \cdot (3 - \tau \cdot \Delta F) \quad |@1 < \tau \cdot \Delta F \leq 3$$

and periodic thereafter, with a period being [4·τ·ΔF], since this quantity corresponds to a 360° phase shift. In summary, within a given operating range, the XOR output 209 would have a duty cycle that changes linearly with ΔF (which is $F_{ref} - F_{in}$), and so the FD DC output 211 would have a voltage that changes accordingly. The frequency range and the gain in Volt/Hz of both bi-level frequency discriminators disclosed here are identical. When AF is substituted with [Fmax] defined here as the frequency difference at the inputs yielding the maximum voltage of Vout=Vcc, and [−Fmax] as the ΔF frequency difference that yields the minimum voltage of Vout=0, then from eq. (44a) it can be inferred that Fmax is related to the delay r by the following equation:

$$F\max = \frac{1}{\tau} \quad (45)$$

henceforth, asserting the FD linear range of the input frequency $F_{in}$(201) spanning from −Fmax to +Fmax around a reference frequency $F_{ref}$(200).

To better see Vout as a function of the input frequency difference ΔF, (44a) may be re-written in the "y=a·x+b" form:

$$Vout = \left[\frac{1}{2} Vcc \cdot \tau\right] \cdot \Delta F + \frac{1}{2} Vcc \quad \text{or also} \quad (46a)$$

$$Vout = \left[\frac{Vcc}{2F\max}\right] \cdot \Delta F + \frac{1}{2} Vcc \quad (46b)$$

$G_{FD}$, the gain of the bi-level FD within this operating range, would be the slope 'a' of this transfer function expressed by eq. (46a) and (46b), thus exhibiting the following relationships:

$$G_{FD} = \frac{Vcc}{2} \cdot \tau \quad \text{or also} \quad (47a)$$

$$G_{FD} = \frac{Vcc}{2 \cdot F\max} \quad (47b)$$

FIG. 12, shows an example of the transfer function where the reference frequency $F_{ref}$ is 100 MHz and the delay τ(207) is 0.2 μs. From eq. (45) it can be computed that the Fmax is 5 MHz. The operating range in this case would be $F_{ref} \pm F_{max}$ or 95 MHz to 105 MHz. It can be seen that the outputs 211 or 222 would change from 0V to Vcc linearly as the input frequency $F_{in}$ changes from the bottom to the top of the range spanning over 2Fmax. Hence, the computed gain in this example would be Vcc/10 MHz =Vcc* $10^{-7}$ [V/Hz]. If this gain was not high enough in order to generate error voltages that could overcome possible PLL circuit offsets or that make the PLL converge fast enough on the reference frequency, the FD circuit would need to switch to a higher gain. Let's say that a gain ten times higher was needed, then the delay τ(207) could be increased ten fold to be 2μs. While the range would narrow down to ±Fmax=±0.5 MHz following eq. (45), from eq. (47a) we would see that the gain would increase to ½ Vcc·2·$10^{-6}$, yielding GFD=Vcc* $10^{-6}$ [V/Hz].

Figure 13:
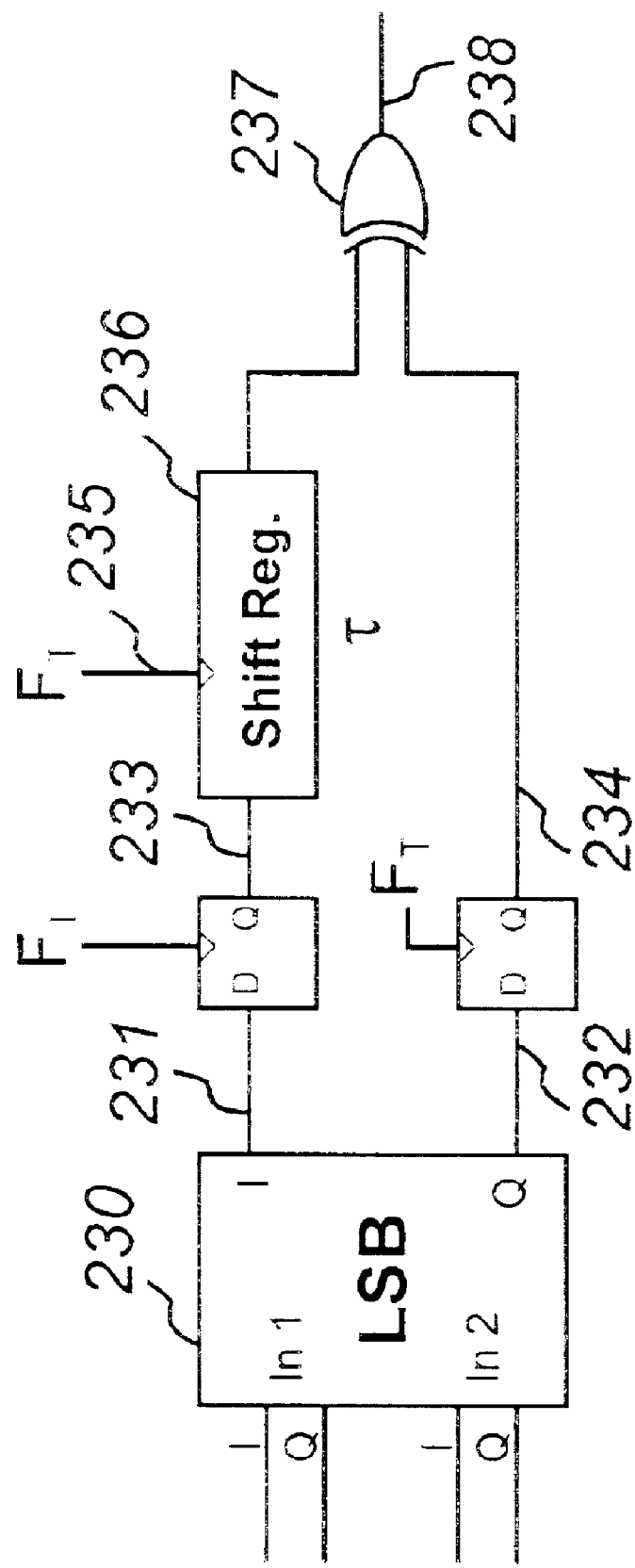
FIG. 13 depicts a delay circuit used in the present invention embodiments of the bi-level FDs, having the capability to be dynamically controlled.

A significant advantage of these FDs is underlined in the above example, being the ability to trade-off range for gain dynamically. When acquiring a signal whose frequency is far away from the desired $F_{ref}$ the delay τ could be dynamically decreased to suit the range needs, and as Fin approaches the target reference frequency then dynamically switch the delay to a longer one suiting the gain needs. A delay circuit implementation allowing its delay period to be dynamically controlled is shown in FIG. 13 and will be discussed later.

Another general feature of the frequency discriminators embodied in this invention is resulting from the periodicity of the XOR function, and thus of the FD transfer function. It can be easily seen from eq. (44a), (44b) and (45) that when the input frequency difference (ΔF) limits are ±Fmax the cyclic period of the transfer function is [4Fmax] (also refer to FIG. 12), and thus inversely proportional to the delay. This property could be used in a system where the PLL could be made to lock on a frequency that differs from the reference frequency, as in the case where $F_{ref}$ is fixed, and it is used to lock a PLL producing $F_{in}=F_{ref} \pm k \cdot [4F\max]$, while still maintaining the constraint of the range being ±Fmax. For example, if $F_{ref}$ is a 10.7 MHz clock and is set to be 4.0 μs yielding Fmax of 250 kHz, the periodicity would be of [4Fmax]=1 MHz. Thus the PLL could lock on any $F_{in}$ frequency on a 1 MHz grid around the 10.7 MHz reference: e.g. . . . 2.7 MHz, 3.7 MHz, 4.7 MHz . . . 10.7 MHz, 11.7 MHz . . . and so on.

Figure 9:
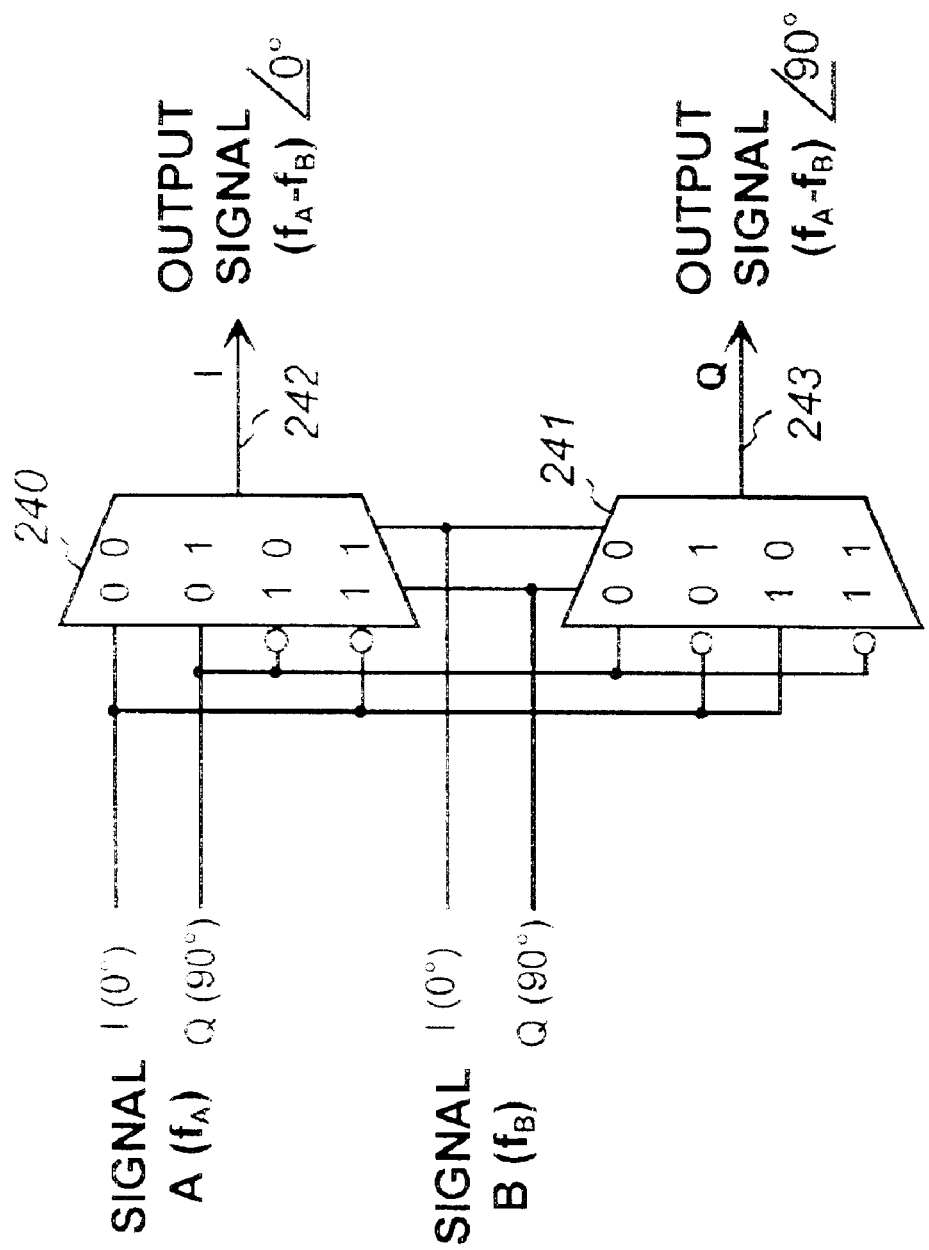
FIG. 9 depicts the Lower Side Band generation block, with complex quadrature outputs I and Q.
Figure 10:
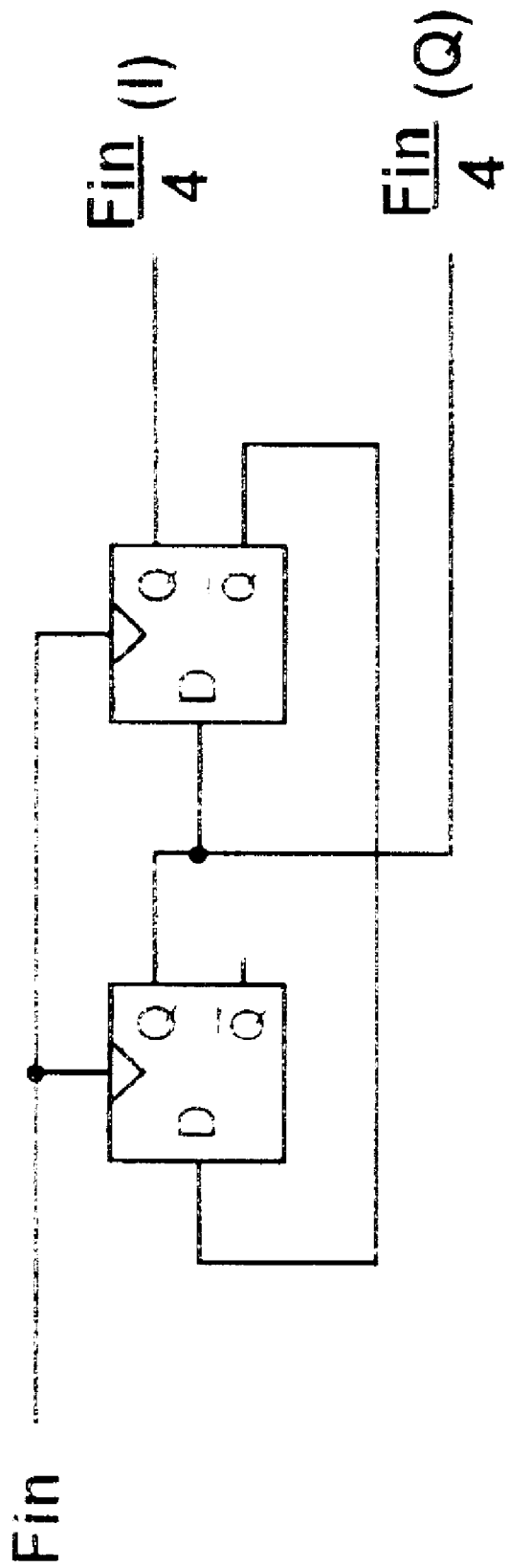
FIG. 10 depicts a prior art synchronous divider by four with quadrature outputs I and Q. This block is also referred in this document as the "÷4(" block FIG. 11 depicts the block diagram of the second embodiment of a bi-level Frequency Discriminator (FD)

The complex LSB block 204 is implemented with two digital multiplexers as shown in FIG. 9, and its description can be found in the commonly assigned U.S. patent application Ser. No. 09/580,513. For optimal operation of the LSB block 204 its input signals need to be square waves having 50% duty cycle, each presented both in-phase (I) and in quadrature (Q). In order to always guarantee such difficult requirement prior to the LSB block it is convenient to divide the input frequencies $F_{in}$(200) and $F_{ref}$(201) by four by means of what are here called "÷4Φ" blocks (202 and 203), which divide by four while providing quadrature outputs I and Q. Moreover, this prior-art "÷4Φ" divider shown in FIG. 10 has the advantage of being duty cycle insensitive, meaning that the input signals $F_{in}$(200) and $F_{ref}$(201) don't need to have 50% duty cycle in order for 202 and 203 to provide accurate square waves. In order to provide a complete FD solution those "÷4Φ" blocks 202 and 203 are included as part of this invention's embodiments. The low-pass filters 210 and 221 are shown as part of the block diagrams of FIG. 7 and FIG. 11 even though they are external to the digital circuit. They are used in conjunction to the invention to provide rejection of the unnecessary AC components generated by the FDs, while extracting the necessary DC term. They are included in the block diagrams in order to provide an illustration of a complete FD system, from input to the desired output of DC error signals that would stir a PLL loop VCO. In most applications these LPFs are essentially the loop filters of the PLL and don't demand additional components. In the more robust FD of FIG. 11 both the summer 220 and the LPF 221 are external. The summer could be as simple as a resistive adder: two resistors each connected to the outputs of the XOR gates 218 and 219, connecting together at the other end. In most applications these resistor could essentially be part of the LPF 221. Unlike the prior art FDs, the circuit components used in the FDs disclosed here do not have memory elements like flip-flops in the critical paths, which limit the operation speed due to their inherent slow propagation times from Reset, D and Clock inputs to their output. Here, the signal processing consisting of the LSB 204 and the XOR 208 are combinatorial in nature. In the present art the only speed limiting components are essentially the dividers "4Φ" blocks 202 and 203. Moreover, these circuit don't suffer from "blind spots" or "dead zones" in the same inherent way that the prior art shown in FIGS. 6A and 6B does. For the purpose of comparison we could say that using a CMOS integrated circuit having typical flip-flop delays of few nano-seconds and gate delays of few hundred pico-seconds this type of FD could easily operate in the 120 MHz range while its Quad-D PFD counterpart would be limited to frequencies below 60 MHz in FD mode and below 30 MHz in the PD mode.

The FD delay elements in the invention could be implemented in various ways. The implementation of choice presented here is using a shift-register 236 clocked at a frequency $F_T$ 235 as seen in FIG. 13. This figure shows a more detailed picture of the delay section of the FD and surrounding components. When a signal is clocked into any register it is effectively sampled at discrete intervals. In order to satisfy the minimum sampling frequency according to the well known Nyquist theorem the clock FT must be at all times higher than 2·ΔF. Since the maximum ΔF of a properly designed FD as discussed earlier is Fmax then the minimum $F_\tau$ must be greater than 2·Fmax. Following eq. (45) it can also be stated that the Nyquist requirement is:

$$F_T > 2/\tau \qquad (48)$$

In a shift-register the total delay X depends on the clock $F_T$ and the number of register stages M by the following equation:

$$\tau = M/F_T \qquad (49)$$

By substituting (49) into the inequality (48) we get:

$$M > 2 \qquad (50)$$

Which becomes our overriding consideration for the selection of an appropriate shift register length M. For design purposes it would be convenient to choose a fixed M and select a clock frequency FT depending on the range desired:

$$F_T = M \cdot Fmax \qquad (51)$$

When the range and the gain of the FD need to be changed dynamically, a simple change of the clock frequency would achieve that. For example, if M=4 and Fmax needs to be narrowed from 10 MHz to 250 kHz, the $F_T$ would need to be switched from 40 MHz to 1 MHz. Another way to control the delay could be keeping the $F_T$ constant, and instead switch in or out a number of taps from the shit register 236. But this type of design usually is more inefficient in terms of hardware gates utilized. FIG. 13, in addition to showing the shift-register 236, it shows two extra registers sampling both the I and Q outputs 231 and 232 of the LSB block 230 at the same clock frequency $F_T$. Those are needed to equalize the initial delay associated with the phase of the sampling clock $F_T$ with the incoming signal. This ensures that the delay as sensed at the inputs of the XOR 237 between the LSB I branch 231 and the Q branch 232 is exactly only the shift-register's delay as calculated by eq. (49), where small propagation delays of the two branches being essentially equal and common-mode cancel each other for the most part, to the point of being utterly insignificant. In addition, at the input of the XOR 237 both inputs are sampled at the same discrete intervals.

A close look of the two bi-level frequency discriminators embodied in this invention reveals that their topology is the same as their analog counterparts described in the opening section of this disclosure and depicted in FIG. 4 and FIG. 3 respectively. To better see this it would be appropriate to liken each analog complex mixer (consisting for example of 70, 75, 76 and 86 of FIG. 3) with a bi-level complex LSB block (204 or 215), and the regular analog mixers (106 and 108) with bi-level XOR gates (208, 218, or 219). The analogy transpires also mathematically likening sinusoidal signals (pure tones) for the analog circuits with bi-level square-wave signals for the digital circuits. Equation (31) shows the mathematical expression for output 128 of FIG. 4; the analogy with the circuit of FIG. 7 can be seen where also in that case the output consists of the DC term and the two spectral components of the "beat" frequency and twice the "beat" frequency. In the case of output 116 of FIG. 3 equation (28) shows that as with the bi-level circuit of FIG. 11 the output consists of the DC term and only one other component being the "beat" frequency of the two input signals. Also analogous is the transfer function of the FD. While in the analog version of FIG. 3 the transfer function is periodic and sinusoidal as seen in FIG. 5, in the bi-level FD of FIG. 11 the transfer function is periodic and triangular in nature as the one seen in FIG. 12, and essentially having the same positive and negative regions.

Figure 1:
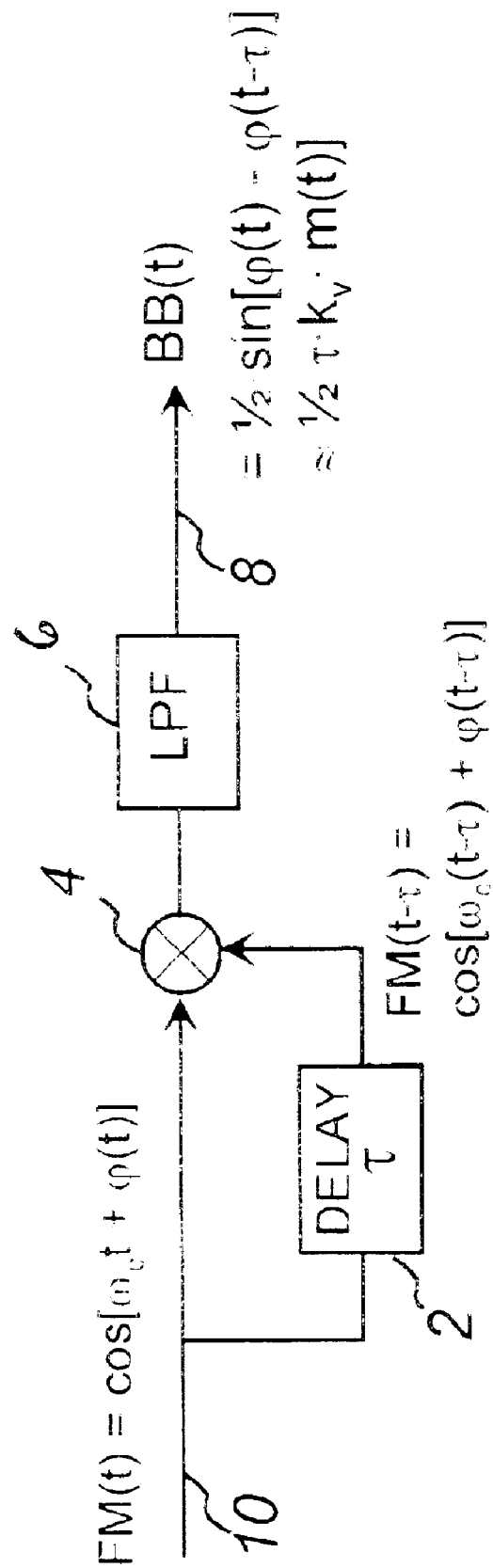
FIG. 1 is an illustration of the functional block diagram of a quadrature FM demodulator of the prior art.
Figure 6A:
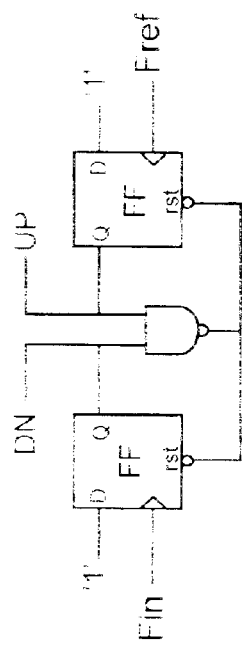
FIG. 6A is a block diagram of a Dual-D Flip-Flop Phase-Frequency Detector (PFD) of the prior art, utilizing two flip-flops in a feedback arrangement.
Figure 6B:
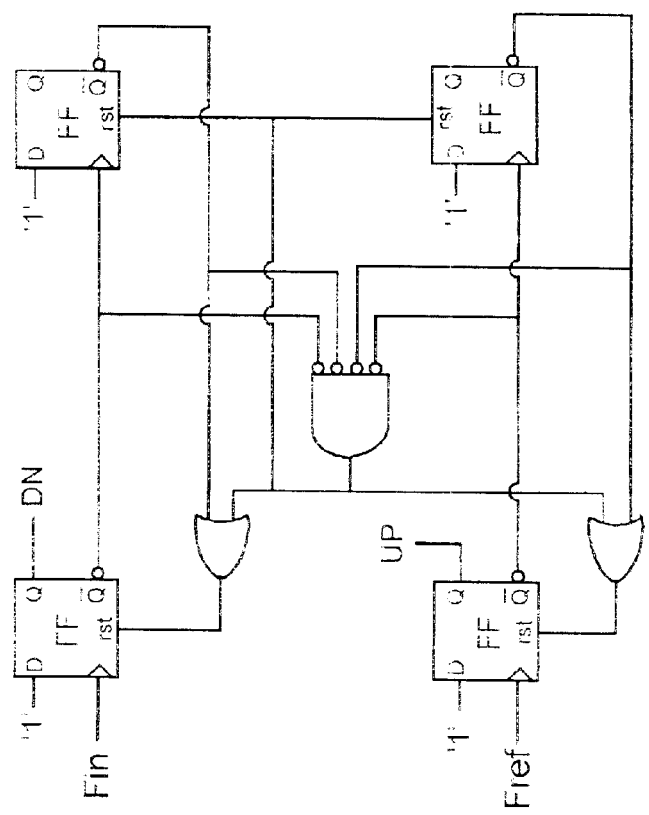
FIG. 6B depicts another prior art PFD, utilizing Quad-D Flip-Flops, as typically implemented in the common industry standard CMOS integrated circuit, such as the widely used CD4046.
Figure 6C:
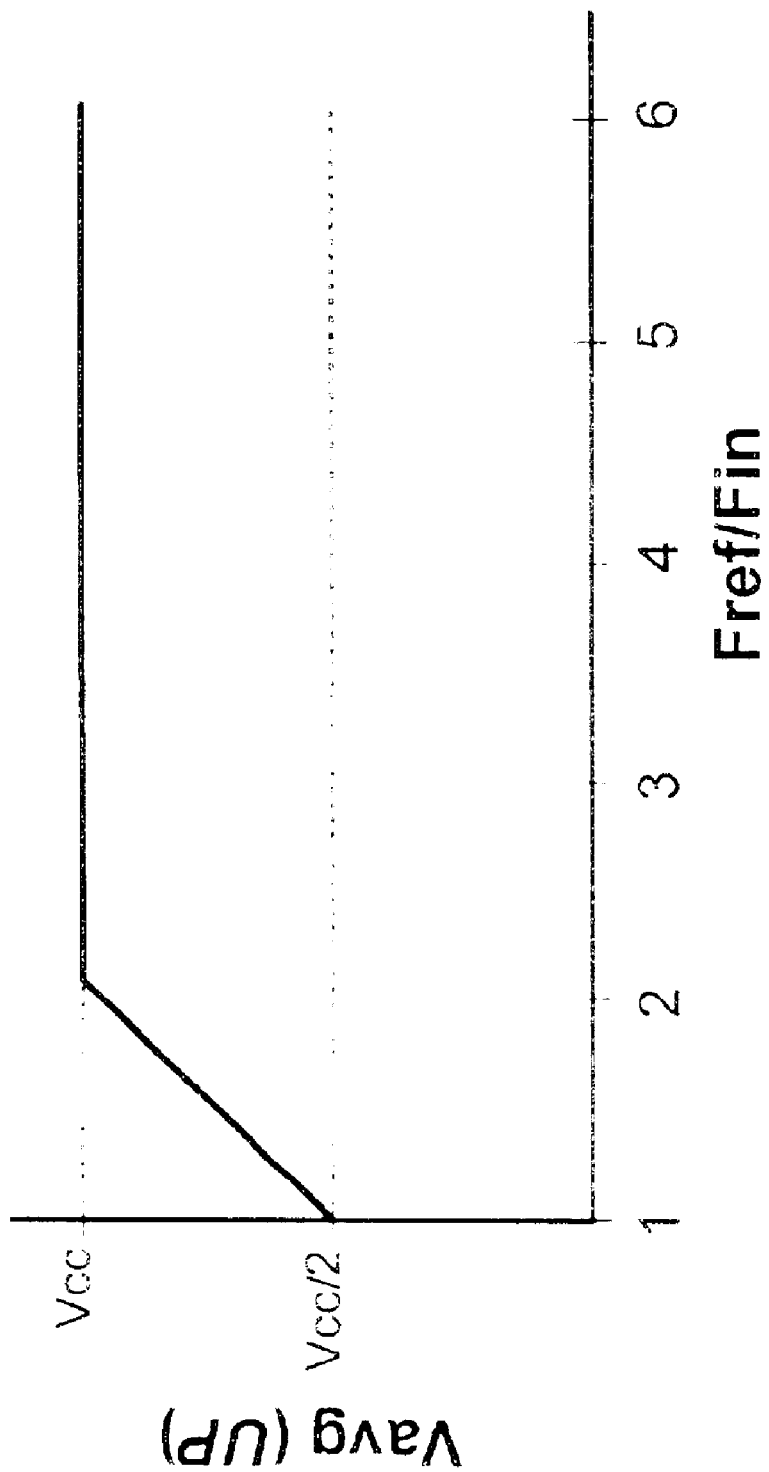
FIG. 6C depicts the transfer function of the frequency discriminator of the prior art of FIG. 6B.
Figure 14:
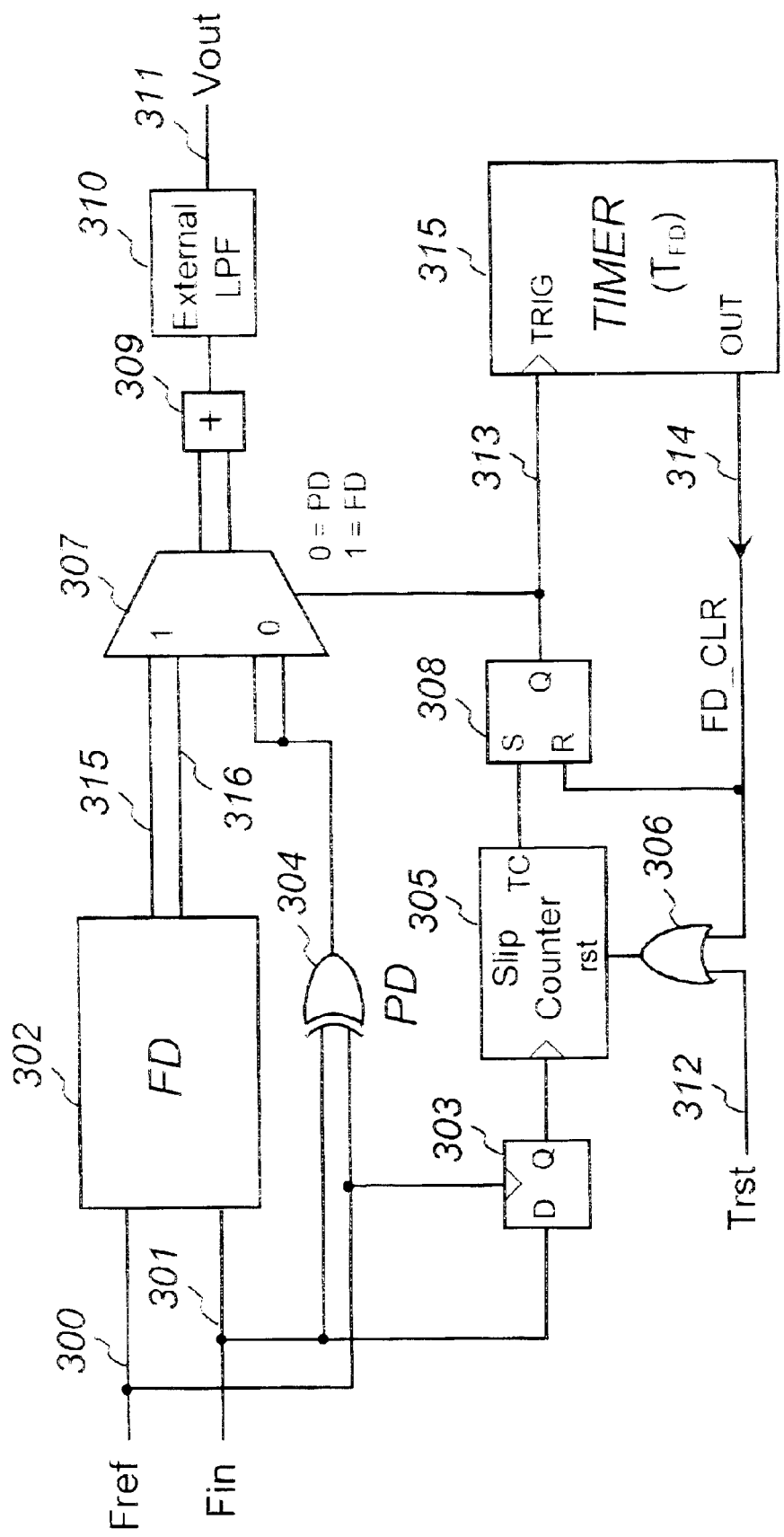
FIG. 14 depicts an apparatus to automatically switch the bi-level frequency discriminator of FIG. 1I with an XOR phase detector when necessary, essentially achieving the combined PFD functionality.

When in a PLL an FD is used to stir the VCO towards the reference frequency the FD alone would never be able to create a phase-lock situation, meaning that it couldn't replace the phase detector function of generating the error voltages necessary to correct and maintain the VCO phase. As explained earlier an FD's DC output component is proportional only to the input frequency differences and not to the phase differences. Hence, a complete PLL solution would only rely on an FD to drive the VCO close enough to the reference frequency, but then would need to transition to a PD to capture and phase-lock the loop VCO. Some prior art circuits as shown in FIGS. 6A and 6B combine both the PD and FD functions in one, 173 and therefore are referred to as PFDs; however, they suffer from the shortcomings outlined in previous discussions. In conjunction with the embodied invention of the bi-level ED an automatic switching was devised that kicks in an FD such as the one shown in FIG. 1I any time the PLL is sensed as not being locked. Subsequently, after a calculated amount of time a simple but efficient XOR PD is switched to transition the PLL from a frequency acquisition state and into a phase-lock state. This new embodiment of the invention is depicted in FIG. 14 showing an apparatus that performs this auto-sensing of phase-lock condition and auto-switching of the FD/PD functions as necessary. In steady-state, when the loop is phase-locked, the PD 304 is engaged through the multiplexer (MUX) 307, which is designed to have two ports each having two inputs: the '0' port connected to the PD and the '1' port connected to the FD outputs 315 and 316). Since the PD element 304 is single ended its output is sourced to both of the inputs of the '0' port of the MUX 307. The two outputs of the MUX are summed by 309, filtered by 310 and ready to drive the loop VCO to maintain phase-lock. In this state Fin (301) and Fref(300) are locked to each other (coherent relationship), and are driven to be 90° away from each other to satisfy the DC lock condition which is when the XOR (304) output duty cycle is 50%. The D-FF 303 is constantly clocking Fin with Fref but since they are both square waves of the same identical frequency it would output a fixed logic state of either '1' or '0'. The Slip Counter 305 is an edge-triggered synchronous divider by K which in this state would never be clocked and thus never reach a "terminal count" (TC) state. Assuming the FD_CLR line 314 being inactive at '0' the slip counter 305 would periodically be reset by signal 312 which is a periodic narrow pulse occurring at intervals Trst. Also, in this steady-state the RS-FF 308 is reset, thus outputting '0' on line 313, which ensures that the MUX 307 is in PD mode and that the timer 315 is not triggered to start. As the loop gets out of lock the $F_{in}$(301) and $F_{ref}$(300) start to shift away from each other and eventually the D-FF 303 would start toggling at about the "beat" rate of the input frequencies generating a series of what we'll referred to as "slip pulses". Whenever the rate of these slip pulses exceeds (K–I)/Trst then the slip counter 305 would reach its full scale and before rolling back to zero a terminal count (TC='1') output would occur. This condition would set RS-FF 308 to output a '1' on line 313, which would in turn switch the MUX 307 to FD mode by routing its '1' port inputs 315 and 316 to summer 309. As in FIG. 11 the FD (302) outputs need to be summed and filtered, here shown by blocks 309 and 310, to generate a final output 311 that would stir the loop VCO in the right direction. In a given PLL circuit the maximum time it would take the FD to pull the VCO frequency to within the loop bandwidth is a predictable parameter that in general depends on the FD gain $G_{FD}$ and the overall loop bandwidth. Therefore, in order to lock a PLL it would be enough to let the FD mode on for just that much, then switch back to PD mode and wait for the loop to converge into a phase-lock state. This timing function is accomplished here by the timer 315. Once the RS-FF 308 is set and line 313 changed to '1' (indicating out-of-lock state) besides causing the switching of MUX 307 to FD mode it also would trigger the timer to start a count for a period of $T_{FD}$. This $T_{FD}$ needs to be greater than the worst-case maximum time required for the frequency lock of the PLL. After this $T_{FD}$ period the timer needs to generate a pulse called here FD_CLR (314) that would extend for another period $T_{FD}$. Henceforth, it would reset the slip counter 305 as well as the RS-FF 308 back to '0', causing the MUX 307 to switch back to PD mode after being in FD mode for $T_{FD}$ time. This reset would remain forced as long as the FD_CLR 314 is '1': a period $T_{FD}$ long. The reason this FD_CLR (314) time is kept active so long is to allow the slip counter 305 to remain clear of any counts while the PLL transitions from frequency acquisition to a steady phase-lock, so as to start afresh once the loop has settled. One additional design consideration would be the selection of a proper slip counter length, and its reset clock period Trst. Both those parameters allow a proper setting of the sensitivity of the phase-lock loss setting traded-off with immunity from possible false "alarms". The slip counter 305 basically accumulates the number of slip pulses generated when Fref and Fin (inputs 300 and 301) are different and non-coherent. The rate of these slip pulses generated by 303 is |Fref–Fin|=ΔF. Thus, the condition for the setting of the terminal count of 305 would be:

$$\Delta F > \frac{(K-1)}{Trst} \qquad (52)$$

K being the count length of the slip counter 305 and as mentioned earlier Trst being the period of the reset pulses on 312. The minimum number of register stages L required by the slip counter relate to K by this expression:

$$L = \lceil LOG_2(K) \rceil \qquad (53)$$

For example, if a count of 8 is required, the length of the slip counter should be 3 registers long.

What is claimed is:

1. A complex single sideband zero IF down-converter frequency demodulator or frequency discriminator/comparator, comprising:

means for receiving and splitting a local oscillator (LO) signal of frequency $\omega_0$ to two components: the in-phase component and the quadrature component;

means for receiving and splitting an input signal of carrier frequency $\omega_c$, to two components: the in-phase component and the quadrature component;

means for multiplying each one of the said in-phase and quadrature LO signal components with each one of the said in-phase and quadrature input signal components, for generating a total of four different converted input signals;

means for combining (adding or subtracting) in two pairs the said four converted signals, producing two lower single sideband signals: the in-phase signal I⁻(t) and the quadrature signal Q⁻(t);

means for delaying each of the said in-phase I⁻(t) and quadrature Q⁻(t) signals by substantially same time delay τ, providing respective delayed baseband signals I⁻(t–τ) and Q⁻(t–τ);

means for multiplying the said delayed signals with the said un-delayed signals, to generate two multiplication products I⁻(t–τ)Q⁻(t) and I⁻(t)Q⁻(t–τ);

means for combining (subtracting) the said two multiplication products, providing the demodulated baseband signal BB(t);

means for outputting the said demodulated baseband signal;

means for generating a local oscillator signal of frequency $\omega_0$, which is related to frequency $\omega^c$ and time delay τ by equation $(\omega_c - \omega_0)\tau \equiv n\pi$, where n=0,±1,±2, . . . .

2. The frequency demodulator of claim 1, wherein the input signal is frequency modulated by transmitted information, having the average frequency equal to $\omega_c$, and the instantaneous frequency deviation proportional to the transmitted information.

3. The frequency discriminator/comparator of claim 1, wherein the input signal is a signal derived from a signal source having a dominant frequency $\omega_c$, which is being compared with the LO frequency $\omega_0$.

4. The frequency demodulator or discriminator/comparator of claim 1, wherein the multiplication operation is replaced with exclusive OR(XOR) logic function, and related signals are bi-level (digital) signals.

5. The frequency demodulator or discriminator/comparator of claim 1, wherein the input signal and/or the LO signal is first scaled in frequency by division with an integer number in a frequency divider.

6. The frequency discriminator/comparator of claim 1, wherein the said frequency discriminator (FD) is switched to a phase detector (PD).

7. A complex single sideband zero IF down-converter frequency discriminator/comparator, comprising:

means for receiving and splitting a local oscillator (LO) signal of frequency $\omega_0$ to two components: the in-phase component and the quadrature component;

means for receiving and splitting an input signal having a dominant frequency $\omega_c$ to two components: the in-phase component and the quadrature component;

means for multiplying each one of the said in-phase and quadrature LO signal components with each one of the said in-phase and quadrature input signal components, for generating a total of four different converted input signals;

means for combining (adding or subtracting) in two pairs the said four converted signals, producing two lower single sideband signals: the in-phase signal $I^-(t)$ and the quadrature signal $Q^-(t)$;

means for delaying only one of the two said signals by time delay $\tau$, providing one delayed base band signal, $I^-(t-\tau)$ or $Q^-(t-\tau)$;

means for multiplying the said delayed signal with one of the said un-delayed signals, to generate one multiplication product, $I^-(t-\tau)Q^-(t)$ or $I^-(t)Q^-(t-\tau)$, providing the baseband signal $BB(t)$;

means for outputting the said demodulated baseband signal;

means for generating a local oscillator signal of frequency $\omega_0$, which is substantially equal to frequency $\omega_c$.

8. The frequency discriminator/comparator of claim 7, wherein the multiplication operation is replaced with exclusive OR(XOR) logic function, and related signals are bi-level (digital) signals.

9. The frequency discriminator/comparator of claim 7, wherein the input signal and/or the LO signal is first scaled in frequency by division with an integer number in a frequency divider.

10. The frequency discriminator/comparator of claim 7, wherein the said FD is switched to a PD.

* * * * *

UNITED STATES PATENT AND TRADEMARK OFFICE
CERTIFICATE OF CORRECTION

PATENT NO. : 6,847,255 B2
DATED : January 25, 2005
INVENTOR(S) : Petrovic et al.

It is certified that error appears in the above-identified patent and that said Letters Patent is hereby corrected as shown below:

Column 20,
Lines 30 and 59, please delete "$\omega_c,$" and replace with -- $\omega_c$ --
Line 55, please delete "$\omega^c$" and replace with -- $\omega_c$ --

Signed and Sealed this

Twenty-sixth Day of April, 2005

JON W. DUDAS
*Director of the United States Patent and Trademark Office*